(12) United States Patent
Lohbihler et al.

(10) Patent No.: US 11,362,657 B2
(45) Date of Patent: Jun. 14, 2022

(54) TOUCH-LESS SWITCHING

(71) Applicant: XYZ INTERACTIVE TECHNOLOGIES INC., Toronto (CA)

(72) Inventors: Andrew H. Lohbihler, Waterloo (CA); Michael Kosic, Toronto (CA); Kevin Kowalchuk, Oakville (CA); Valentin M. Burtea, Toronto (CA)

(73) Assignee: XYZ INTERACTIVE TECHNOLOGIES INC.

( * ) Notice: Subject to any disclaimer, the term of this patent is extended or adjusted under 35 U.S.C. 154(b) by 0 days.

(21) Appl. No.: 16/924,784

(22) Filed: Jul. 9, 2020

(65) Prior Publication Data
US 2020/0350911 A1 Nov. 5, 2020

Related U.S. Application Data

(63) Continuation of application No. 16/431,091, filed on Jun. 4, 2019, now Pat. No. 10,749,525, which is a (Continued)

(51) Int. Cl.
*H03K 17/94* (2006.01)
*G08C 17/02* (2006.01)
(Continued)

(52) U.S. Cl.
CPC ........... *H03K 17/941* (2013.01); *G08C 17/02* (2013.01); *H03K 17/78* (2013.01); *H05B 45/10* (2020.01);
(Continued)

(58) Field of Classification Search
CPC ................. H03K 17/941; H03K 17/78; H03K 2217/94112; G08C 17/02; G08C 2201/32; H04W 4/21; G06F 3/017
See application file for complete search history.

(56) References Cited

U.S. PATENT DOCUMENTS 3,898,383 A 8/1975 Herbits
4,924,109 A 5/1990 Weber
(Continued)

FOREIGN PATENT DOCUMENTS

CA 2758017 A1 10/2010
CN 101568211 A 10/2009
(Continued)

OTHER PUBLICATIONS

First Office Action dated Jul. 13, 2018, from Chinese Patent Application No. 201580041659.4, 17 sheets.
(Continued)

*Primary Examiner* — Anh Q Tran
(74) *Attorney, Agent, or Firm* — Katten Muchin Rosenman LLP

(57) ABSTRACT

A light switch network comprises a plurality of light switch units, each comprising a gesture interface to sense a user gesture by receiving at least one gesture signal from a sensing zone, and configured to exchange one or more gesture status signals with at least one other switch unit in the network in relation to the received gesture signal; each switch being enabled, on receiving the gesture signal: in a first mode, to change a designated switch mode and/or state in response to the gesture signal; or in a second mode, to not change the designated switch mode and/or state according to one or more conditions associated with the status signals received from the other switch unit.

8 Claims, 24 Drawing Sheets

Related U.S. Application Data continuation of application No. 15/967,065, filed on Apr. 30, 2018, now Pat. No. 10,320,384, which is a continuation of application No. 15/315,695, filed as application No. PCT/CA2015/000383 on Jun. 1, 2015, now abandoned.

(60) Provisional application No. 62/007,134, filed on Jun. 3, 2014, provisional application No. 62/006,686, filed on Jun. 2, 2014.

(51) Int. Cl.
| | | |
|---|---|---|
| *H03K 17/78* | (2006.01) | |
| *H05B 45/10* | (2020.01) | |
| *H05B 47/19* | (2020.01) | |
| *G06F 3/01* | (2006.01) | |
| *H04W 4/21* | (2018.01) | |
| *H05B 47/195* | (2020.01) | |
| *H05B 47/10* | (2020.01) | |
| *H05B 47/17* | (2020.01) | |

(52) U.S. Cl.
CPC .............. *H05B 47/10* (2020.01); *H05B 47/17* (2020.01); *H05B 47/19* (2020.01); *G06F 3/017* (2013.01); *G08C 2201/32* (2013.01); *H03K 2217/94052* (2013.01); *H03K 2217/94112* (2013.01); *H04W 4/21* (2018.02); *H05B 47/195* (2020.01)

(56) References Cited

U.S. PATENT DOCUMENTS

| | | | |
|---|---|---|---|
| 5,594,238 | A | 1/1997 | Endruschat et al. |
| 5,712,558 | A | 1/1998 | Saint-Cyr et al. |
| 5,977,878 | A | 11/1999 | Lang |
| 5,977,882 | A | 11/1999 | Moore |
| 6,107,938 | A | 8/2000 | Feng Du et al. |
| D435,473 | S | 12/2000 | Eckel et al. |
| 6,163,275 | A | 12/2000 | Hartzell |
| 6,369,517 | B2 | 4/2002 | Song et al. |
| 7,115,856 | B2 | 10/2006 | Peng et al. |
| 7,116,056 | B2 | 10/2006 | Jacoby, Jr. et al. |
| 7,518,738 | B2 | 4/2009 | Cavallucci et al. |
| 7,656,308 | B2 | 2/2010 | Atkins et al. |
| 7,761,814 | B2 | 7/2010 | Rimas-Ribikauskas et al. |
| 7,804,422 | B2 | 9/2010 | Liu et al. |
| 7,973,589 | B2 | 7/2011 | Rothenberger |
| 8,217,482 | B2 | 7/2012 | Basoor et al. |
| 8,294,576 | B2 | 10/2012 | Matsuoka et al. |
| 8,363,894 | B2 | 1/2013 | Gerber et al. |
| 8,416,217 | B1 | 4/2013 | Eriksson et al. |
| 8,507,863 | B2 | 8/2013 | Holenarsipur |
| 8,981,913 | B2 | 3/2015 | Henig et al. |
| 9,137,878 | B2 | 9/2015 | Thompson |
| 9,462,664 | B2 | 10/2016 | Engel-Hall |
| 9,839,099 | B2 * | 12/2017 | Lark, Jr. .............. F21V 23/0485 |
| 10,320,384 | B2 * | 6/2019 | Lohbihler .............. H05B 47/17 |
| 2007/0193582 | A1 | 8/2007 | Kwok et al. |
| 2011/0107216 | A1 | 5/2011 | Bi |
| 2011/0121181 | A1 | 5/2011 | Costello et al. |
| 2011/0316453 | A1 | 12/2011 | Ewing |
| 2012/0248992 | A1 | 10/2012 | Jeon et al. |
| 2012/0262071 | A1 | 10/2012 | Briggs |
| 2013/0141009 | A1 | 6/2013 | Jin et al. |
| 2013/0214166 | A1 | 8/2013 | Barlow et al. |
| 2013/0300316 | A1 | 11/2013 | Engle-Hall et al. |
| 2014/0062334 | A1 | 3/2014 | Nagazoe et al. |
| 2014/0225526 | A1 | 8/2014 | Jonsson |
| 2015/0139483 | A1 * | 5/2015 | Shen ................ H05B 47/115 382/103 |
| 2015/0285623 | A1 | 10/2015 | Tachibana |
| 2021/0043398 | A1 | 2/2021 | Lohbihler |

FOREIGN PATENT DOCUMENTS

| | | |
|---|---|---|
| CN | 101675712 A | 3/2010 |
| CN | 102413614 A | 4/2012 |
| CN | 102724793 A | 10/2012 |
| CN | 103415125 A | 11/2013 |
| CN | 101874427 A | 10/2020 |
| EP | 0392152 A2 | 10/1990 |
| EP | 1178454 B1 | 2/2002 |
| EP | 1552988 A3 | 7/2005 |
| EP | 1815723 A1 | 6/2006 |
| WO | 2010085877 A2 | 8/2010 |
| WO | 2013085600 A2 | 6/2013 |

OTHER PUBLICATIONS

Second Office Action dated Apr. 1, 2019, from Chinese Patent Application No. 201580041659.4, 15 sheets.
Third Office Action dated Jul. 19, 2019, from Chinese Patent Application No. 201580041659.4, 10 sheets.
Fourth Office Action dated Jan. 15, 2020, from Chinese Patent Application No. 201580041659.4, 7 sheets.
Ex Parte Quayle Action dated Dec. 30, 2019, from U.S. Appl. No. 16/431,091, 18 sheets.
Notice of Allowance dated Apr. 13, 2020, from U.S. Appl. No. 16/431,091, 20 sheets.
Notice of Allowance dated Feb. 6, 2019, from U.S. Appl. No. 15/967,065, 33 sheets.
Non-Final Rejection dated Jul. 14, 2017, from U.S. Appl. No. 15/315,695, 28 sheets.
Notice of Allowance dated Jan. 31, 2018, from U.S. Appl. No. 15/315,695, 36 sheets.
Ryu, Dongseok, et al., T-less : a Novel Touchless Human-Machine Interface based on Inftared Proximity Sensing, IEEE/RSJ International Conference on Intelligent Robots and Systems, Mar. 12, 2010.
"Gesturesense Z-40-D" datasheet, XYZ Technologies Inc., Mar. 21, 2011.
International Search Report for International Application No. PCT/CA2015/000383, dated Nov. 19, 2015.
Written Opinion for the International Search Authority for International Application No. PCT/CA2015/000383, dated Nov. 19, 2015.

* cited by examiner

TOUCH-LESS SWITCHING

REFERENCE TO COPENDING APPLICATIONS

This application is a continuation of U.S. patent application Ser. No. 16/431,091, filed Jun. 4, 2019, which is a continuation of U.S. patent application Ser. No. 15/967,065, filed Apr. 30, 2018, now U.S. Pat. No. 10,320,384, issued Jun. 11, 2019, which is a continuation of U.S. patent application Ser. No. 15/315,695, filed Dec. 1, 2016, now abandoned, which is a 371 of international PCT/CA2015/000383, filed Jun. 1, 2015,which claims priority to U.S. patent application No. 62/007,134, filed Jun. 3, 2014 and 62/006,686, filed Jun. 2, 2014, and this application claims the priority and herein incorporates by reference the entire disclosure and subject matter of each of the preceding applications. Additionally, the entire disclosure and subject matter of each and every application named below is incorporated herein by reference, including all information as originally submitted to the United States Patent and Trademark Office and to the PCT Receiving Office:

- U.S. Provisional Patent Application No. 61/147,711; filed Jan. 27, 2009 entitled "A METHOD AND APPARATUS FOR RANGING FINDING, ORIENTING, AND POSITIONING OF SINGLE OR MULTIPLE DEVICES";
- PCT Patent Application CA2010/000095; filed Jan. 27, 2010 entitled "A METHOD AND APPARATUS FOR RANGING FINDING, ORIENTING, AND POSITIONING OF SINGLE AND/OR MULTIPLE DEVICES" and designating the United States;
- U.S. Provisional Patent Application No. 61/367,787; filed Jul. 26, 2010 entitled "A METHOD AND APPARATUS FOR RANGING FINDING, ORIENTING, AND POSITIONING OF SINGLE AND/OR MULTIPLE DEVICES";
- U.S. Provisional Patent Application No. 61/369,994; filed Aug. 2, 2010 entitled "A METHOD AND APPARATUS FOR RANGING FINDING, ORIENTING, AND POSITIONING OF SINGLE OR MULTIPLE DEVICES";
- U.S. Provisional Patent Application No. 61/371,053; filed Aug. 5, 2010 entitled "A TOUCH-LESS TOGGLE/DIRECTIONAL LIGHT SWITCH AND DIMMER"; and
- U.S. patent application Ser. No. 13/189,878; filed: Jul. 25, 2011 entitled "A METHOD AND APPARATUS FOR RANGING FINDING, ORIENTING, AND POSITIONING OF SINGLE AND/OR MULTIPLE DEVICES".

FIELD

The present disclosure relates generally to touch-less electrical switches, for example for use in lighting.

BACKGROUND

Mechanical light switches are as ubiquitous today as electric lighting. More recently, contactless or gesture sensing light switches are disclosed in the literature, including for instance U.S. Pat. No. 7,115,856 to Peng et al, and US 2013/0300316 to Engle-Hall et al. While such recent contactless or gesture sensing light switches offer, in theory, a fundamental advance from their widely available mechanical predecessors, they have not become widely available, owing in part to their still relatively limited applications and relatively high cost, when compared with such conventional mechanical predecessors.

It would thus be desirable to offer the public with at least a useful alternative.

SUMMARY

In an aspect, there is provided a light switch network comprising a plurality of light switch units, each comprising a gesture interface to sense a user gesture by receiving at least one gesture signal from a sensing zone, and configured to exchange one or more gesture status signals with at least one other switch unit in the network in relation to the received gesture signal; each switch being enabled, on receiving the gesture signal:
   a. in a first mode, to change a designated switch mode and/or state in response to the gesture signal; or
   b. in a second mode, to not change the designated switch mode and/or state according to one or more conditions associated with the status signals received from the other switch unit.

Some exemplary embodiments may include one or more features, as follows below and in the present disclosure. For instance, in a first of the conditions, before receiving the gesture signal, the switch unit may receive a status signal from the other switch unit indicating that the other switch unit received an earlier corresponding gesture signal. In a second of the conditions, the switch unit may receive a status signal indicating that the other switch unit received a stronger corresponding gesture signal. In a third of the conditions, the switch unit may receive a status signal indicating that the other switch unit is selected and/or enabled to respond to a corresponding gesture signal. Each switch unit may be configured to display a current one of the first mode and second modes. The switch units may be adjacent or nonadjacent, and communicating via a wired, or wireless data path, in which case the adjacent switch units may be located in a gang box.

In another aspects, there is provided a light switch device for use in a light switch network, comprising a gesture interface to sense a user gesture by receiving at least one gesture signal from a sensing zone, and configured to exchange one or more gesture status signals with at least one other switch device in the network in relation to the received gesture signal; the switch device being enabled, on receiving a the gesture signal:
   c. in a first mode, to change a designated switch mode and/or state in response to the gesture signal; or
   d. in a second mode, to not change the designated switch mode and/or state according to one or more status signals received from the other switch device.

Some exemplary embodiments may include one or more features, as follows below and in the present disclosure. For instance, devices may provide a display to indicate a current one of the first and second modes. Devices may further comprise at least one signal exchanger directed at a target location for the other switch device. Devices may further comprise a plurality of signal exchangers directed in opposite lateral directions relative to a designated wall surface, for communication with a plurality of other switch devices. Devices may further comprise a housing with a plurality of passages, each aligned with a corresponding signal exchanger. The signal exchangers may including signal transmitters and/or receivers and/or transceivers. The passages may located near opposed corner regions of the housing.

In another aspect, there is provided an assembly of light switches according to any aspect and exemplary embodiment described herein.

In another aspect, there is provided a network of light switches according to any aspect and exemplary embodiment described herein.

In another aspect, there is provided a light switch assembly comprising an array of switch units, each switch unit configured to sense a user gesture by receiving a gesture signal indicative thereof, and to change a designated switch state in response thereto, each switch unit in the array being further configured to exchange one or more operational signals with one or more neighboring switch units in the array.

Some exemplary embodiments may include one or more features, as follows below and in the present disclosure. For instance, the operational signals may relate to gestures sensed by a switch unit sending the operational signals. The operational signals may include instructions to change an operational mode from a first mode to a second mode. Adjacent switch units may be configured to be within range of one another at designated locations in a switched zone, wherein the switched zone may be a room, among other possible zones. Assemblies may further comprise one or more remote devices configured to issue signals to be received by the receivers. Switch units may be configured to communicate information in the form of data bits to each other in a multiple access manner. Switch units may be configured to be assigned an identifying code for a source of the data bits therefrom.

In another aspect, there is provided a switch assembly comprising an array of switch units, each switch unit configured to sense a user gesture by receiving a gesture signal indicative thereof, and to change a designated switch state in response thereto, each switch unit in the array being further configured to exchange one or more interrupt signals with one or more designated switch units in the array; each switch unit being configured to function in a first interrupt mode to originate one of said interrupt signals after receiving a first gesture signal, and to function in a second interrupt mode to receive one of the interrupt signals originating from another switch unit in the array, each switch unit further configured to suspend, in the second mode, a subsequent change of the designated switch state under one or more designated conditions.

Some exemplary embodiments may include one or more features, as follows below and in the present disclosure. For instance, the other switch unit may a neighboring switch unit. In one of the designated conditions, the interrupt signal may received before the switch unit receives a second gesture signal corresponding to the first gesture signal of the designated switch operating in the first interrupt mode. In one of said designated conditions, the interrupt signal may be received after the switch unit receives a second gesture signal corresponding to, but at a lower strength compared with the first gesture signal received by the neighbouring switch operating in the first interrupt mode. Switch units may be configured to indicate when the switch unit is operating in at least one of the first mode and the second mode. Switch units may be adjacent or nonadjacent, and communicating via a wired, or wireless data path. Adjacent switch units being located in a gang box.

In another aspect, there is provided a switch device for use in a switch array of switch devices, comprising a gesture sensor configured to sense a user gesture by receiving a gesture signal indicative thereof, a controller configured to:
   a. change a designated switch state in response to the gesture signal;
   b. exchange one or more interrupt signals with one or more neighboring switch devices in the array;
   c. in a first interrupt mode to originate one of said interrupt signals after receiving a first gesture signal,
   d. in a second interrupt mode to receive one of the interrupt signals originating from another switch unit in the array, and
   e. to suspend, in the second mode, a subsequent change of the designated switch state under one or more designated conditions.

Some exemplary embodiments may include one or more features, as follows below and in the present disclosure. For instance, devices may further comprising one or more signal transmitters, each oriented to transmit the one or more interrupt signals, in the first interrupt mode, to the corresponding neighboring switch device. Devices may further comprise one or more receivers, each oriented to receive the one or more interrupt signals, in the second interrupt mode, from the corresponding neighboring switch device. Devices may further comprise a housing, wherein the signal transmitters and receivers are each aligned with one of a plurality of passages formed therein. Adjacent switch units may be locate in a gang box.

In another aspect, there is provided a switch device for use in a switch array of switch devices, comprising a gesture sensor configured to sense a user gesture by receiving a gesture signal indicative thereof, a controller configured to:
   a. change a designated switch state in response to the gesture signal;
   b. exchange one or more interrupt signals with one or more neighboring switch devices in the array;
   c. in a first interrupt mode to originate one of said interrupt signals after receiving a first gesture signal,
   d. in a second interrupt mode to receive one of the interrupt signals originating from another switch unit in the array, and
   e. to suspend, in the second mode, a subsequent change of the designated switch state under one or more designated conditions.

Some exemplary embodiments may include one or more features, as follows below and in the present disclosure. For instance, devices may comprise one or more signal transmitters, each oriented to transmit the one or more interrupt signals, in the first interrupt mode, to the corresponding neighboring switch device. Devices may further comprise one or more receivers, each oriented to receive the one or more interrupt signals, in the second interrupt mode, from the corresponding neighboring switch device. Devices may further comprise a housing, wherein the signal transmitters and receivers are each aligned with one of a plurality of passages formed therein. Signal transmitters may be enabled to emit a plurality of pulses in a train of pulses, each pulse having a different pulse strength from one pulse to another along the train, the controller configured to determine a range of the appendage from a count representative of pulses received by each receiver above a designated threshold. Controllers may be configured to change a designated switch state output according to a range of a gesturing appendage. Controllers may be configured to change the state of the output after processing a minimum designated number of trains of pulses. Transmitters may be configured to emit electromagnetic radiation in a conical wave broadcast.

In another aspect, there is provided a light switch device for controlling circuitry coupled thereto, said switch device comprising a sensor interface including at least one pulse sensor for sensing a user gesture; at least one processor in communication with the at least one sensor for processing one or more sensor signals received therefrom to carry out a designated switching action and/or change of switch mode and/or state associated with the user gesture, the processor configured to provide one or more first control signals to said circuitry according to the designated switching action and/or change of switch state, the switch device further comprising a light emitting diode (LED) array associated with, and distributed around a peripheral region of, the sensor interface, the processor configured to provide one or more second control signals, to the LED array, for displaying a switching representation indicative of the switching action or change of switch state.

Some exemplary embodiments may include one or more other features as follows. For instance the LED array may be configured, in response to the second control signals, to display a plurality of colors for the switching representation. The LED array may be configured, in response to the second control signals, to activate at least one first LED group of one or more LEDs in the array for a first designated time period to present a first designated position along the array according to the switching representation. The LED array may configured, in response to the second control signals, to activate at least one second group of one or more LEDs in the array for a second designated time period to present a second designated position along the array according to the switching representation. The LED array may be configured, in response to the second control signals, to activate successive groups of one or more LEDs in the array for each designated time period to present a LED lighting sequence across the array according to the switching representation. The circuitry may be enabled to place a light in a designated switching mode between an electrical ON state and an electrical OFF state, and said LED array provides a visual indication of said designated state. The circuitry may control an intensity of a light fixture, and said LEDs provide a visual indication of said intensity. The sensor may comprises at least one emitter configured to emit electromagnetic radiation for reflection by a gesturing user's appendage and detected by at least one receiver. A dimming mode may be configured to provide a designated number of intensity levels between the electrical ON and OFF states, according to a clocking speed of the processor. Devices may further comprise at least a pair of emitters along a first axis defining a gesture path, and at least a pair of receivers along a second axis perpendicular to the gesture path. The sensor may be configured to accept an infrared (IR) transmitted signal from a remote IR controller. The IR transmitted signal may have a carrier frequency from 36 KHz to 5 MHz. The LED array may be enabled to flash during at least one of the switching actions and/or the change in switch modes. The LED array may be enabled to flash during a DIMMING mode. The processor may be is enabled, on a change from an ON/OFF mode to a DIMMING mode, to enable a timer for a designated time period. The processor may be enabled, following passage of the designated time period, to revert to a previous ON/OFF mode. The processor may be enabled, to maintain or to change a current mode and/or state, on sensing a sudden gesture away from a sensing zone. Devices may further comprise a housing configured with an outer surface providing the sensor interface.

In another aspect, there is provided a light switch device for controlling circuitry coupled thereto, said switch device comprising a housing with an outer surface, the circuitry including an LED lamp array located on the outer surface, a pulse sensor interface located on the outer surface and including at least one pulse sensor for sensing a user gesture; at least one processor in communication with the at least one sensor for processing one or more sensor signals received therefrom to carry out a designated switching action and/or change of switch mode and/or state associated with the user gesture, the processor configured to provide one or more control signals to said circuitry according to the designated switching action and/or change of switch mode and/or state.

In another aspect, there is provided a light switch device, comprising a gesture interface, the interface configured to receive a signal from a neighboring detection zone, a display region adjacent the interface, the display region oriented to represent a switch display path between a maximum light mode and a minimum light mode, the display region including a plurality of light emitting diodes (LEDs), the interface configured to activate one or more of the LEDs to present one or more of a sleep mode, the maximum light mode, the minimum light mode, and a mode between the maximum and minimum light modes.

Some exemplary embodiments may include one or more features, as follows below and in the present disclosure. For instance, the sleep mode may represented by a central LED activated in a first color. The maximum light mode and minimum light mode may each be represented by second and third colors respectively. The second and third colors may be the same. The display region may include a pair of display paths alongside the interface, with LED's positioned along each display path. The display region may include a peripheral display path along a peripheral region of the interface, with LED's positioned along the peripheral display path. The peripheral display path may encircle the interface.

In another aspect, there is provided a hands-free light switch device, comprising a processor, a gesture sensor in communication with the processor, and an output, the gesture sensor including one or more pulse emitters and one or more pulse receivers, the processor configured to process data corresponding to signals received by the one or more receivers, to detect range and/or movement of a gesturing user appendage, the processor configured to relate a range value and/or a movement value to an intended change from a first mode and/or state to a second mode and/or state, and to issue a control signal at the output to enable the intended change, and one or more position indicators responsive to the processor and configured to display one or more signals indicative of the intended change.

Some exemplary embodiments may include one or more features, as follows below and in the present disclosure. For instance, the position indicators may be configured to display the first and second states as locations on an at least one indicator axis. The indicator axis may be vertically oriented in an operative position. Devices may further comprise a wall mountable housing. Devices may include configurations wherein one emitter is positioned between two receivers, or wherein one receiver is positioned between two emitters. Processors may be configured to identify an originating one of the emitters of the signal received by the receiver. The outputs may further comprise a switch driver configured to open or close an electrical circuit. Devices may further comprise an audio signal generator for issuing an audio signal corresponding to the change of state.

In another aspect, there is provided a hands-free switch device, comprising a processor, a motion sensor in communication with the processor, and an output, the motion sensor including one or more signal emitters and one or more signal receivers, the processor configured to process data corresponding to signals received by the one or more signal receivers, to detect range and/or movement of a gesturing user appendage, the processor configured to relate a range value and/or a movement value to an intended change between at least two modes and/or states, and to issue a control signal at the output to enable the intended change of modes and/or state, wherein a first of said modes and/or states corresponds to an ON/OFF switch mode, a second of said modes and/or states corresponds to a DIMMER mode, and a third of modes and/or states corresponds to a SLEEP mode.

Some exemplary embodiments may include one or more features, as follows below and in the present disclosure. The signal receivers may be configured to receive one or more first signals from the emitters and/or one or more second signals originating from a remote device. The first and second signals may have a common carrier frequency. The second signals may operatively mimic the first signals. The second signals may be data-based gesture signals, from a gesture sensed by the remote device. The remote device may include a portable computing device. Devices may further comprise a substrate carrying the processor, and a number of heat generating components, the substrate including one or more heat conductive layers formed to provide a heat transfer link between the heat generating components a designated location for thermal coupling with an external cooling element. Cooling elements may include, at least in part, an external ground plate.

In another aspect, there is provided a portable computing device comprising a touch screen, at least one processor running at least one computer program adapted to configure the touch screen to receive one or more gesture instructions for adjusting an operational state of a light switch device, and to issue infrared (IR) instructional signals in accordance with an operational signal protocol of the light switch device, the instructional signals corresponding to one or more of the gesture instructions.

Some exemplary embodiments may include one or more features, as follows below and in the present disclosure. For instance, portable computing devices may be selected from a smart phone, a tablet or a notebook computer, among others.

In another aspect, there is provided a non-transitory computer readable medium having recorded thereon statements and instructions for execution by a processor on a smart phone, said statements and instructions comprising:
  a. configuring a touch screen on the smart phone to generate touch screen data following user interaction with the touch screen corresponding to one or more gesture instructions for adjusting an operational state of a target light switch device;
  b. configuring an infrared (IR) transceiver to exchange operational data signals with the target light switch device in accordance with an operational signal protocol of said target light switch device; and
  c. enabling the transceiver to send operational data signals corresponding to one or more of the gesture instructions.

Some exemplary embodiments may include one or more features, as follows below and in the present disclosure. For instance, statements and instructions may further comprise enabling the transceiver to receive a reply signal from the target light switch including a current operational state thereof.

In another aspect, there is provided a light switch device comprising at least one processor running at least one computer program adapted to control one or more operational lighting states, a sensor in communication with the processor for sensing ambient light levels in an adjacent region, the processor enabled to control the device when ambient light levels, relative to a designated transition level, wherein the processor is enabled to switch off the light switch when the ambient levels are above the designated transition level.

Some exemplary embodiments may include one or more features, as follows below and in the present disclosure. For instance, processors may be enabled to access stored light profile data, and to associate sensed data therewith to determine a switch off or a switch on condition. Processors may be enabled to store a baseline light data profile. Processors may be enabled to update the baseline data profile over time. Processors may be enabled to determine the designated transition level as a configured difference in light level from the base line data profile.

In another aspect, there is provided a light switch device comprising at least one processor running at least one computer program adapted to control one or more operational lighting states, a sensor in communication with the processor for sensing motion in a surrounding region, the processor configured to change a designated security status from a low level to a high level according to a sensed motion, and to dispatch a signal to a remote monitoring agent according to the change in the designated security status.

In other aspects, there are provided devices, assemblies, methods, and /or networks as shown or described.

Any one feature, element, condition, step or limitation in any one aspect, embodiment, statement in the disclosure may be combined with other features, elements, conditions, steps or limitations.

BRIEF DESCRIPTION OF THE DRAWINGS

In the drawings, which depict various aspects of exemplary embodiments.

DETAILED DESCRIPTION OF EXEMPLARY EMBODIMENTS

Figure 1A:
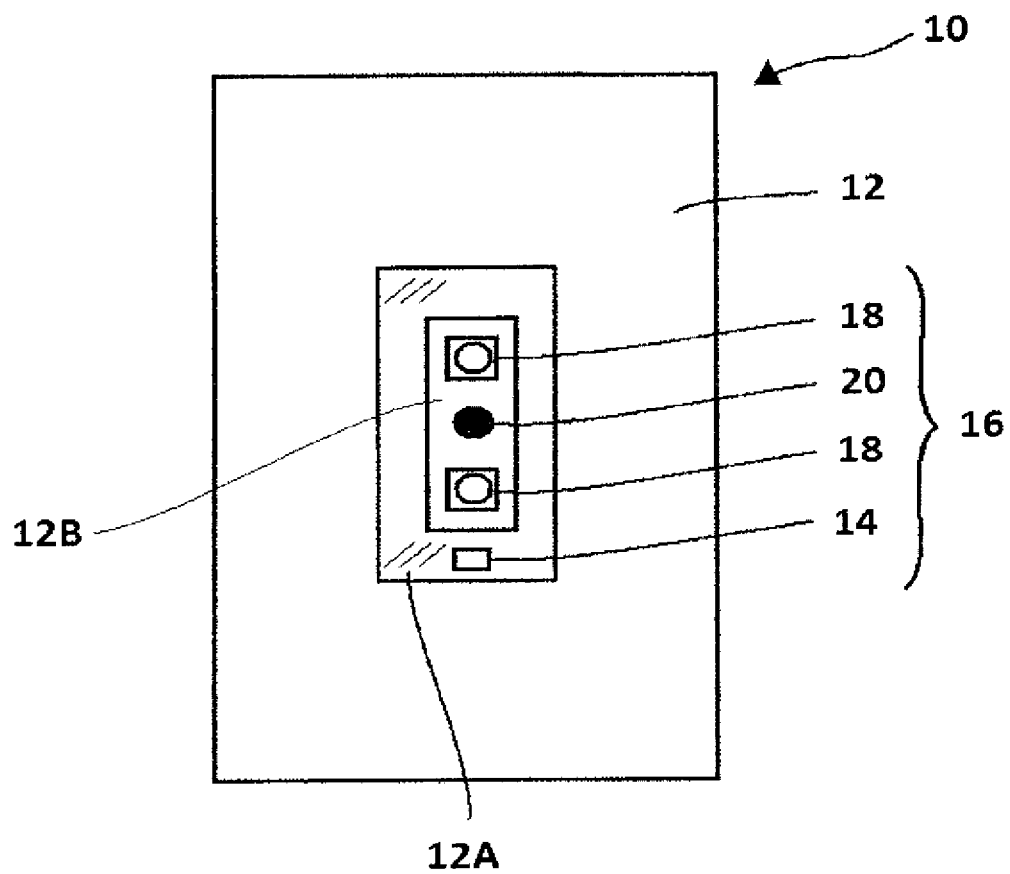
FIG. 1A is a frontal plan view of an exemplary embodiment of a switch device, with one emitter and two receivers.

It should be understood that the disclosure is not limited in its application to the details of construction and the arrangement of components set forth in the following description or illustrated in the drawings. The disclosure is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical or electrical connections or couplings. Furthermore, and as described in subsequent paragraphs, the specific mechanical or electrical configurations illustrated in the drawings are intended to exemplify embodiments of the disclosure. However, other alternative mechanical or electrical configurations are possible which are considered to be within the teachings of the instant disclosure. Furthermore, unless otherwise indicated, the term "or" is to be considered inclusive. Further, the term "a" when followed by a single recitation of a named feature is to be construed inclusively, to mean that it includes within its meaning, more than one of the named feature, or more than one feature including the named feature.

The term "gesture" herein refers to a movement of a part or appendage of a user's body, such as a hand or one or more fingers, according to one or more designated movements to express an intended action.

The term "gesture sensor" herein refers to a device capable of receiving signals originating from, or reflected from, the part or appendage of the user's body, during the course of a gesture. Such signals are disclosed, for example, in PCT application PCT/CA2010/000095.

The term "range" refers to a distance measurement between a receiver of signals and a transmitter or reflector of the signals, for example as disclosed in PCT application PCT/CA2010/000095. A "range value" refers to a representation of the distance measurement, and which changes proportionally with changes thereto. When sensors in an array are monitoring a moving object, they will generate changing range values which may be processed collectively to characterize the movement of the object, including speed, acceleration, and/or position.

As disclosed in PCT/CA2010/000095, the term "pulse" refers to a burst of a carrier frequency signal emitted by an emitter. The pulses are emitted in a sequence or train of pulses, which each pulse having a varying signal strength from one pulse to the next forming collectively an uneven pulse profile, which may be, for example, ramped, undulating, or random. The pulse strengths may progressively increase, progressively decrease or change according to designated or random function along the train. The strength of each pulse will change with changing distance being traveled by the train of pulses, since the signal will degrade over distance and in a predictable way. This means that the pulse strength profile will change according to the distance travelled by the train of pulses. One way to characterize the profile is to count the pulses in the train, since the count will, for example, be reduced with increasing distance, because relatively lower strength pulses become no longer detectable. A pulse strength threshold value may be used to determine the countable pulses above the threshold and the uncountable pulses below the threshold. The count therefore may be used as an inverse measure of distance.

A "pulse sensor" refers to a receiver which is enabled to receive a signal having one or more trains or sequences of pulses.

A "pulse emitter" refers to an emitter enabled to issue a signal representative of one or more pulses in one or more trains or sequences of pulses.

The terms "gesture interface" and "sensing interface" refer to a plane or surface defining a zone for sensing a gesture by a user's appendage, enabled by pulse sensors, on one side of the interface, to sense objects on an opposite side by signals reflected off the user's appendage (or emitted by an emitter on the user's appendage), where the interface is transparent to the signals travelling therethrough.

The term "mode" herein refers to a designated function. The term "state" refers to a condition according to the mode. A mode may have more than one state.

The term "zone" refers to a volume of space adjacent designated location, such as an interface. A sensing zone is the volume of space beside a sensing interface in which the presence of a user's appendage may be sensed. A user's appendage may be considered to leave the zone when signals therefrom are no longer measurably sensed.

The term "gang", in the context of ganged switch devices, refers to an array, assemblage, set or associated group of switch devices, in which each switch is operatively responsive to at least one other switch therein.

FIG. 1A illustrates an exemplified light switch device 10, when seen from a front wall mounted cover plate 12. The cover plate 12 may include a transparent panel 12a, such as glass, to allow passage of signal transmissions, such as infrared (IR) radiation, to pass therethrough for the functioning of one or more emitters and sensors located in the switch device 10, for signaling and detection purposes, as will be described below.

Figure 2:
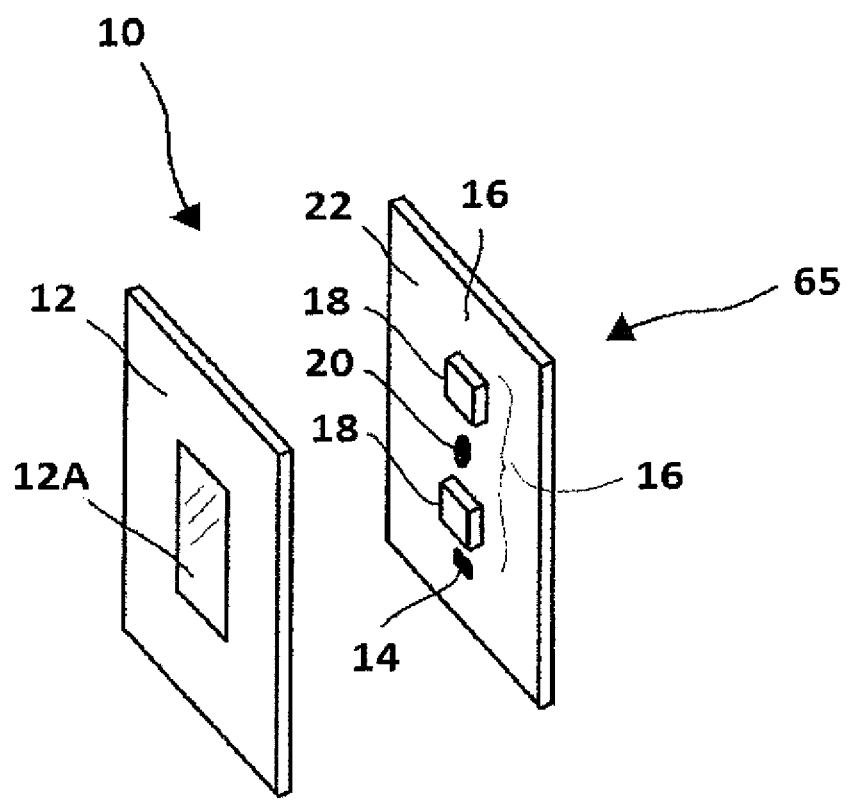
FIG. 2 is a perspective assembly view of the switch device of FIG. 1.

As shown in FIG. 2, the switch device 10 includes a support 22 supporting a visual indicator 14 (such as a LED utility light) for indicating various switch states during operation of the switch device 10. In one state, the visual indicator 14 is activated during the switch OFF state, for dark or night-time use as a "night light". Located behind the cover plate 12, and aligned with the panel 12a, is a motion detection sensor assembly 16, which includes one or more detectors (or receivers) 18 and one or more emitters 20. In this case, one emitter 20 is placed between two receivers 18. If desired, the cover plate may contain, alternatively, an IR transparent panel shown at 12b (as shown in FIG. 1A), which is transmissive to IR signals only to reduce ambient interference from the nearby room or the visual indicator 14.

Figure 1B:
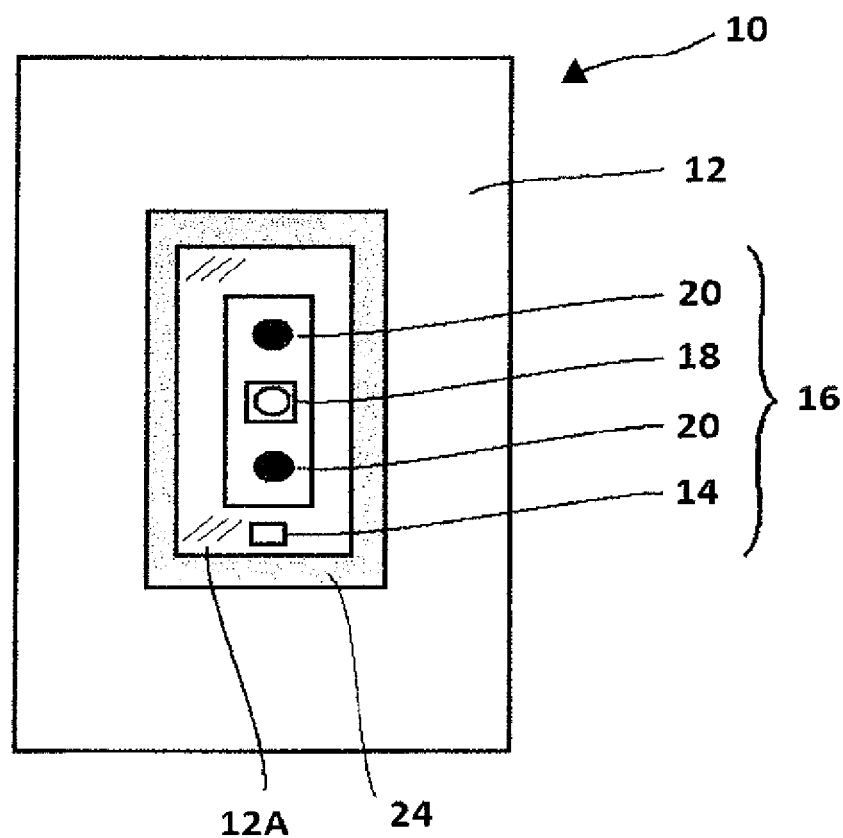
FIG. 1B is a frontal plan view of an exemplary embodiment of a switch device, with two emitters and one receiver, and with an LED light array.

Referring to FIG. 1B, the switch device 10 may be provided with one receiver 18 placed between two emitters 20. An LED display 24, in this case in the form of an array of LEDs behind a transparent ring or band, is also deployed surrounding the switching sensor The LED display 24 is operable to illustrate the actions of the switch in terms of the hand movements, in this example using color to aid the process of switching representation, as will be described.

Figure 1C:
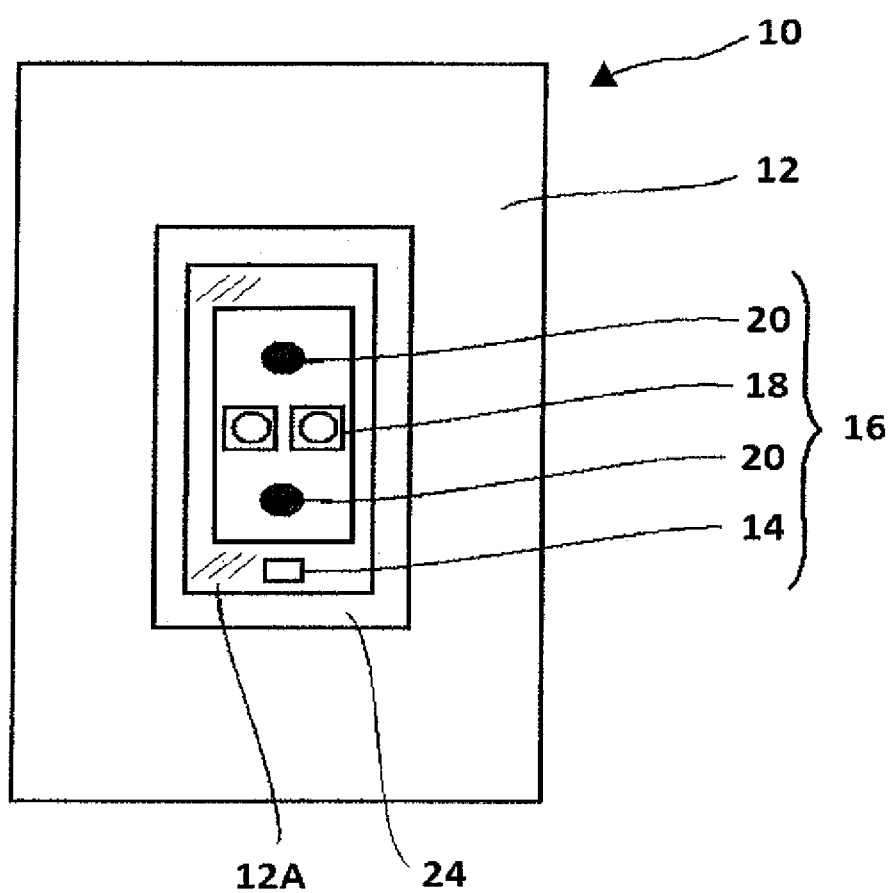
FIG. 1C and FIG. 1D are frontal plan view of further exemplary embodiments.

Referring to FIG. 1C, the switch device 10 may be further configured with two receivers 18 between the emitters 20 but also in spaced relation to the emitters 20 and in spaced relation to each other.

Figure 1D:
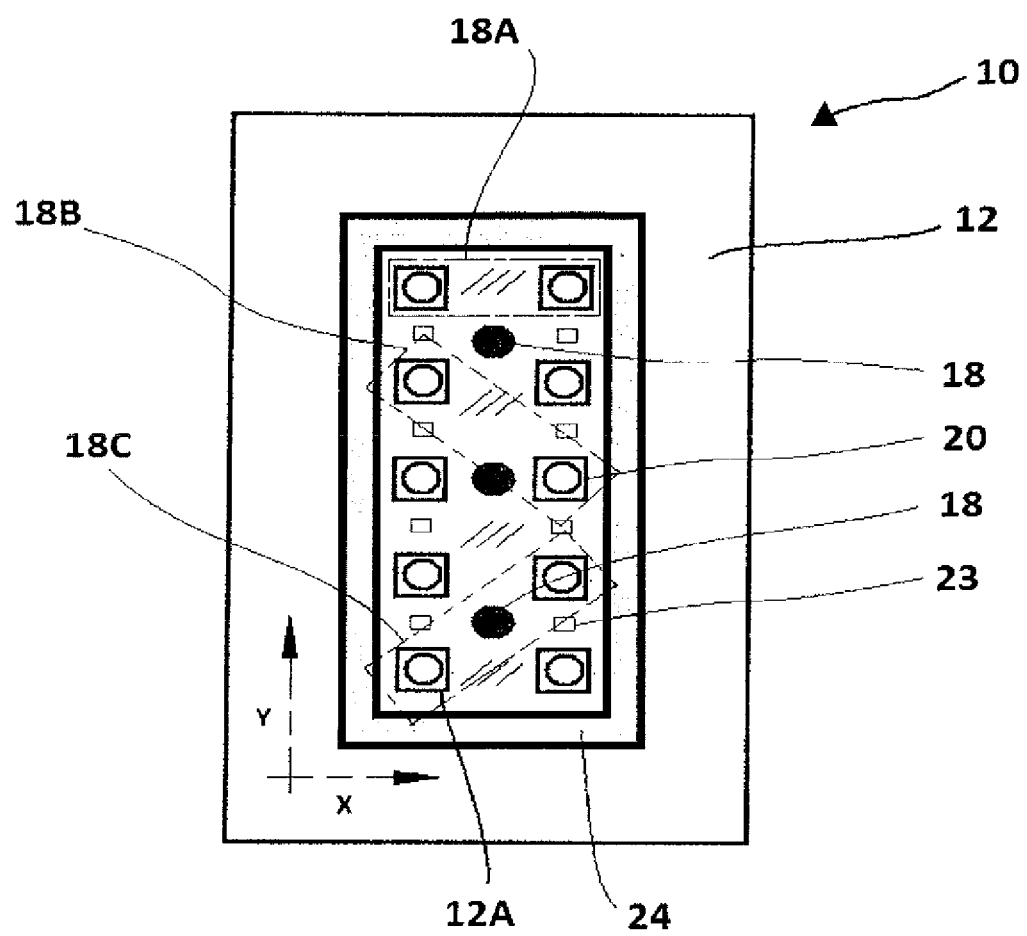

Referring to FIG. 1D, the switch device may be provided with a number of centrally located emitters 20 and detectors 18 surrounding the emitters 20, and behind an IR panel 12a. If desired, the switch device may also be provided with LED indicator lights shown at 23 for indicating user activity at the switch, that is on detecting of a gesture. The emitters and receivers are in a matrix, in which selected ones of the receivers are oriented in x and y axes, allowing for movement to be detected in both directions arising in non-linear gesture movements.

Figure 3:
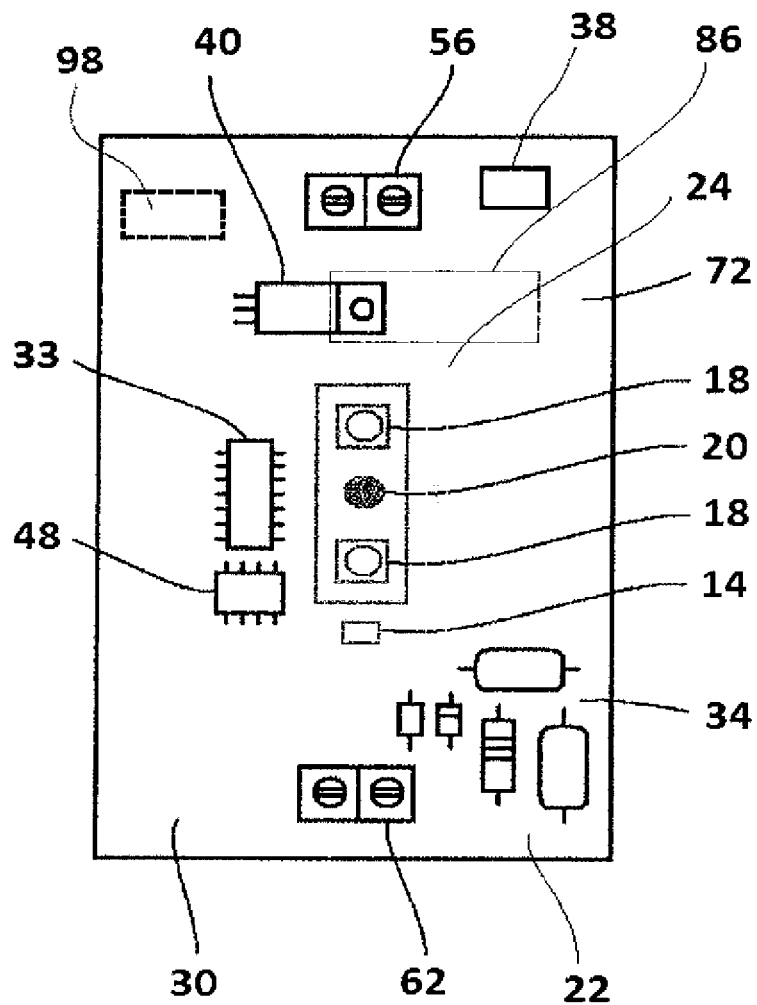
FIG. 3 is a back plan view of the embodiment of the switch circuit support.
Figure 4:
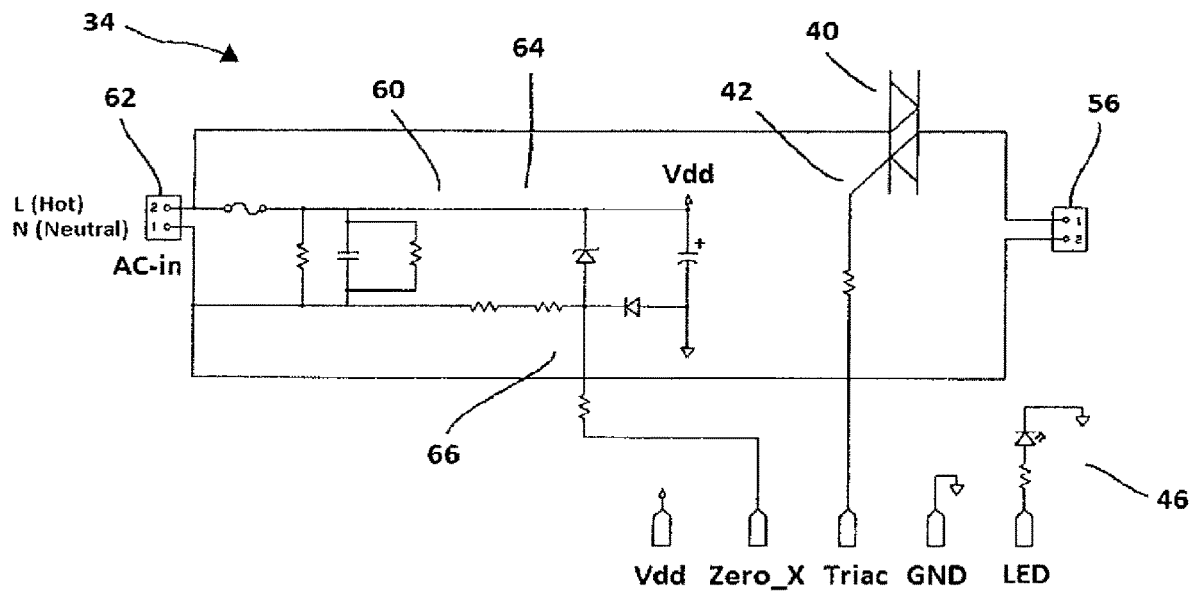
FIG. 4 is a schematic showing a schematic of exemplary components of the switch device of FIG. 3.
Figure 5:
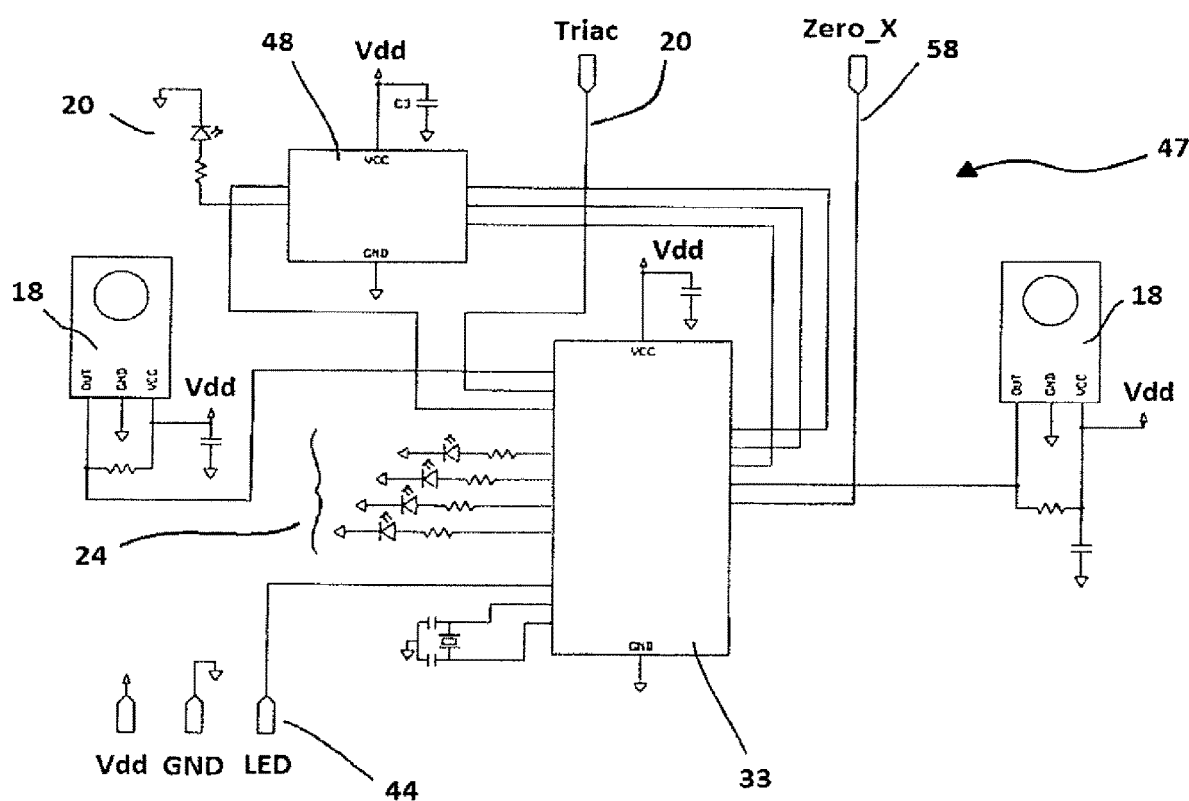
FIG. 5 is a schematic showing a schematic of exemplary components of the detector sensor portion of the switch device of FIGS. 1 through 3.

Referring to FIGS. 3, 4 and 5, the support 22 carries a processor 33, which communicates with each receiver 18, emitter 20, and visual indicator 14, or the LEDs in the display LED 24. The support 22 also contains the circuitry supporting a powering circuit 34 to power the processor 33 and a communication link 38, as shown in FIG. 3.

Figure 5A:
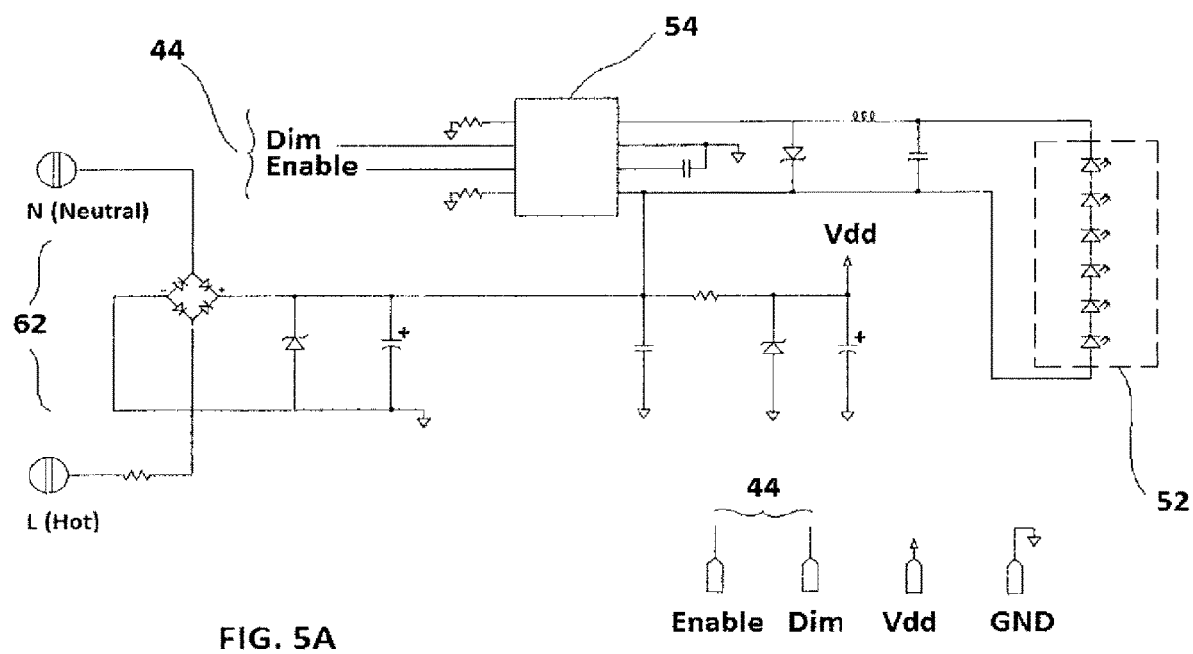
FIG. 5A is a schematic of an LED driver circuit that uses instructional signal inputs from a gesture switch sensor.

FIGS. 4 and 5 depict schematics of a circuit to switch and dim an incandescent-, or a fluorescent- based lighting system to switch or dim using an operation utilizing a "Triac", shown at 40, which is supplied by powering circuit 34 and used to alter the phase of a powering line voltage, using a control signal present on path 42 from the processor (CPU) 33. FIG. 4 also depicts an electrical schematic of a powering circuit 34, that may switch and dim an LED based lighting system shown in FIG. 7. A triac based light control circuit typically uses a "zero-crossover" signal pulse from the AC waveform as a reference signal to instruct the CPU when to switch-OFF the triac during the AC cycle phase. Referring to FIG. 5A, an LED based lighting system typically will use a PWM (pulse width modulated) control signal on PWM signal path 44 presented to a current regulator 48, that is used to alter the electrical current to an IR LED light emitter. FIG. 5 depicts a sensor module 47 which includes the motion and gesture sensor assembly 16 as a standalone circuit section on the support 22 or as separate and removable module. The sensor module 47 includes the processor 33, digital resistor 48, detectors 18, and the emitter 20. The processor 33 also communicates with the LEDs of the LED display 24.

Processor 33 may be provided, for example, as an 8-bit flash-based PICMICRO® microcontroller available from Microchip Technology Inc. of Chandler, Ariz. The memory elements of processor 33, or separate memory associated therewith, "saves and stores" the desired status (e.g., "ON," "OFF," intensity of power, etc.) of the circuit, during the operating modes of the switch device 10. The CPU also store in its memory algorithms to detect specific gestures, and look-up tables and algorithms to relate the hand distance measurement to a specific triac phase switch-off time.

It some exemplary embodiments, the switch device 10 may be configured to transition between a switch mode and a dimmer mode without using a manual switch or any "jumpers" on the switch circuit. A timer is triggered by the processor 33 when the switching function is in the ON state and the user's hand is placed in the IR beam. In so doing, the switch is in State "0" and a timer is activated (after a few seconds) to enter dimming. The user's hand may thus move in a range relational manner to alter the light intensity using a range calculating algorithm in the processor 33. In some cases, the dimmer may be suppressed completely, or a manual switching function may over-ride the switch and dimmer. For this purpose "jumpers" may be provided to change operating modes. Similarly a PIR or long-range switch sensor, or an external or remote infrared controller may alter the switching mode. In this case, the gesture sensor may be configured to accept an IR transmitted data packet to instruct the switch accordingly.

Figure 7:
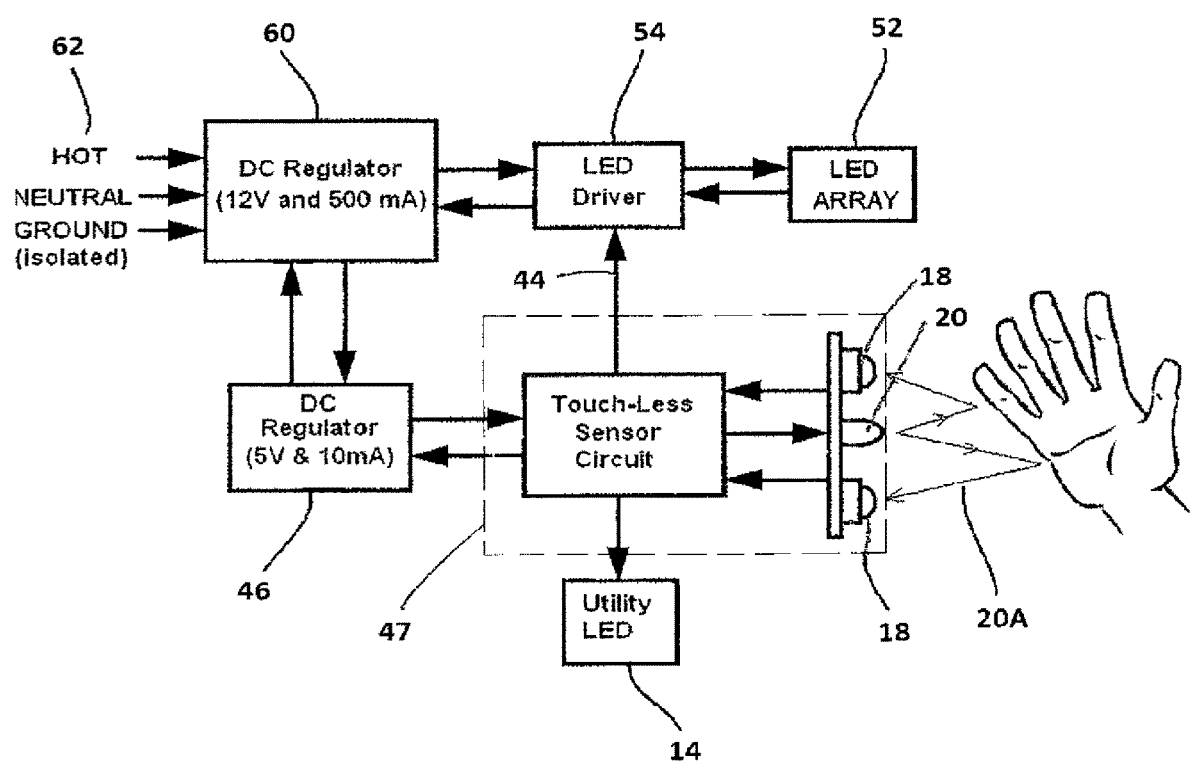
FIG. 7 is a schematic showing exemplary components of an LED based switch device configuration of FIGS. 2 and 3.

As shown in FIG. 7, a module may be provided exclusively for LED lighting including a sensor module, to carry out DC voltage switching. The switch device 10 may utilize one or more regulators 46, 60 as desired to provide power to the sensor circuit and an LED lighting array 52. Powering may be available for circuits that require dimming or not, in which case that they need a cross-over signal for phase synchronization. Dimming for DC powered LED's alternatively require a PWM (pulse wave modulated) signal input 44 to the LED driver circuit 54 to dim the LED lighting array 52.

The module may only need a switch sensor powered with DC and feed signaling as a pulse-width modulated (PWM) signal, as well as an Enable (i.e. ON/OFF) signal. LED driver integrated circuit chips are commercially available to provide LED driver circuits for this configuration. An example of a driver circuit for LED lighting is an LM3407 (from Texas instruments Inc.) using ENBLE and PWM signal inputs from a gesture sensor, and powering from AC or from a DC source is shown in FIG. 5A. Such a module may typically be compact and low-cost, and may not require attributes associated with AC main voltages and loads (such as: noise, EMI, over-voltage surges, shock hazards, etc.). Such modular designs may be suited for lighting applications such as LED desk lamps, under-counter kitchen lighting, etc. Such signaling information may not necessarily communicate directly with the light control devices, but also with a radio transceiver, such as via communication link 38, or to an external processor via a multi-wire serial interface, for example. Such external devices can be PDA's, computers, or special purpose controllers.

The processor 33 may send signals that may be indicated on the visual indicator 14 (or indicators 23 or LED display 24) in a way that may be correlated with the activity of the switch device 10, for a user to relate the changes of switch status to activity related to the switch operation. An example is to switch the visual indicator 14 ON when the switch 10 is OFF (allowing the user to use the switch at night), and the visual indicator 14 OFF when the switch 10 is ON. Also when the switch reverts over to DIMMING mode the visual indicator 14 may, in one exemplary embodiment, revert to flash ON/OFF for about one second intervals (for example) to indicate that DIMMING is in progress, and stop flashing to indicate that DIMMING has completed. Alternatively, the visual indicator 14 may be set to a duty cycle to indicate the level of light intensity output to the illuminating light by way of output terminal 56 (as shown in FIG. 4).

Figure 6:
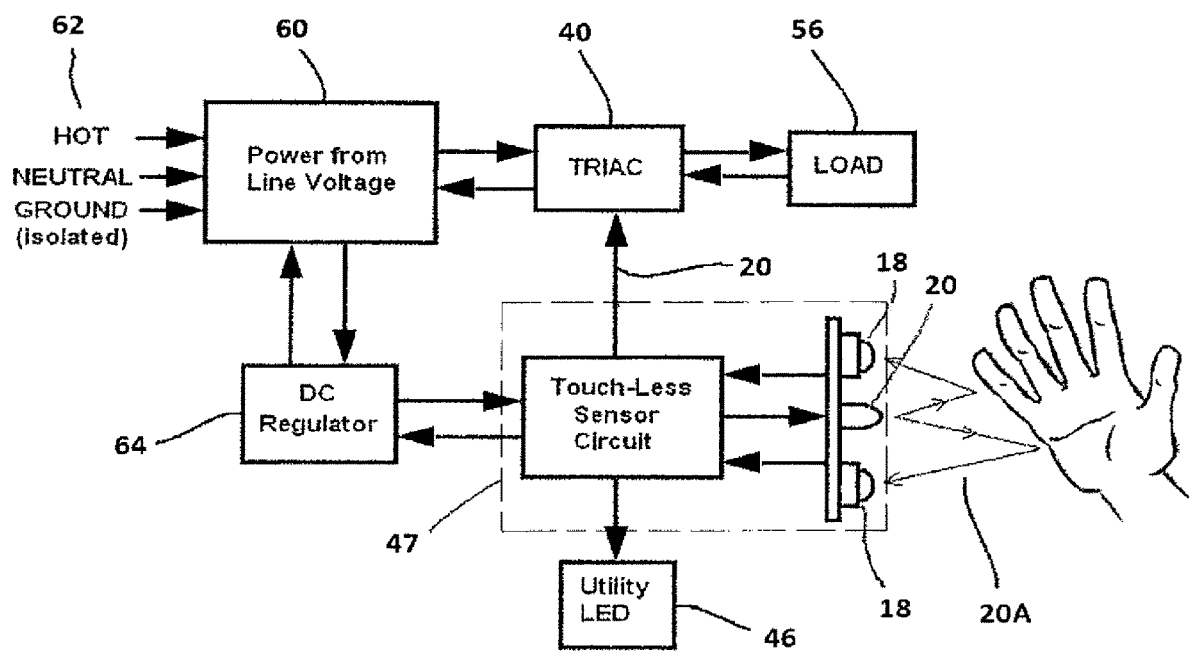
FIG. 6 is a schematic showing exemplary components of a Triac phase-based switch device configuration of FIGS. 2 and 3.

The emitter 20 is configured to emit an Infrared (IR) beam outwardly from the switch device 10, that is through the transparent panel 12*a*, while the detectors 18 are configured to sense reflected IR beams travelling back into the switch device 10 through the panel 12*a*. Another embodiment may enable a user to transition the switch between manual SWITCH and DIMMING modes using gestures applied to the switch 10 by the user. Referring to FIGS. 6 and 7, such an example of gesture-based mode switching is for the user to hold their hand over the emitter beam 20*a* for a time duration (for example 2 seconds), and at a designated and/or specific distance from the switch 10, allowing the processor 33 to operate a timer and switch to DIMMING mode. The termination of DIMMING mode may be alternatively "switched" by applying a similar or different gesture recognized by the switch 10, for example, by keeping the hand stationary for an additional time period (2 seconds for example). DIMMING may also be terminated by allowing a maximum time to perform an illumination setting to take place.

Figure 10:
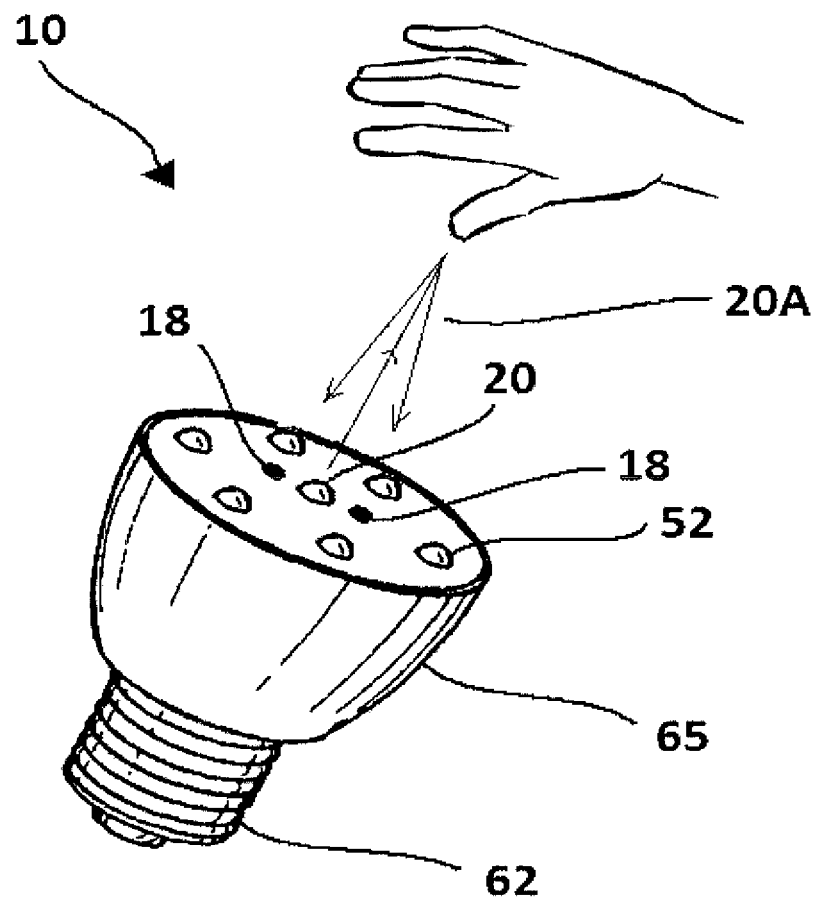
FIG. 10 is a perspective view of an LED light employing a Z and X sensor.

Referring to FIG. 10, and further to the control of the LED or LED array 52, a control circuit with processor 33, digital resistor 48, and motion sensor assembly 16 may be incorporated entirely into the housing of an LED lamp or bulb 53. The detectors 18 and emitter 20 are placed centrally, that is in the middle of, the lamp face and may be exposed to the exterior like the lighting LED array also shown on the exterior of the bulb. The switch may be operated by waving the hand or object across the bulb 53 to achieve ON and OFF states, and dimming may be operated by moving the hand toward and away from the bulb 53.

Referring to FIGS. 4 and 5, as may be required for synchronization purposes, a zero cross signal may be extracted from the line sine wave from line voltage terminals 62 and associated parts of the circuit. A power circuit 34 may be configured to extract the needed power supply to not apply an unpredictable phase shift in the AC line. A zero cross over indicating signal may then be issued on zero crossover link 58 to the processor 33 to begin the phase timing allowing the output phase signal to be in synch with the AC presented to the illuminating light. As an alternative, processor 33 may be programmed to synchronize the signals. A cross-over signal may not be required for the control of a DC operated light such as for powering and controlling the intensity of an LED or LED array.

Emitter(s) 20 is typically an IR transmitter that emits IR radiation of one or more desired wavelengths. This emitter may also operate at radio frequencies, and using ultrasonic waves using the principle of ranging outlined in the patent application PCT/CA2010/000095 using a method of "ranging" developed by XYZ Interactive Technologies. This technology outlines a method of using an emitter transmitting a specifically modulated transmission to a reflecting object (for example, human hand), hence reflections are received by detectors and decoded for "ranging". By way of example only, emitter 20 may comprise an IR emitter that emits radiation in the near IR spectral band of electromagnetic radiation spectrum. Without limiting the scope of the present disclosure, the LED may have modulation in the form of a carrier frequency, as well as a sequence or train of pulses, each sequence in a designated burst at the said carrier frequency. Typical IR LED's radiate at 36 KHz to 56 KHz for commercial communication uses related to television and home entertainment uses. However, this exemplary embodiment may operate at higher carrier frequencies such as at 455 KHz upwards to 5 MHz for IRDA and other carrier frequencies and associated modulation rates.

The emitter(s) 20 operates under the control of the processor 33, which causes the emitters to emit in a pulsed and pulse modulated fashion. The processor 33 is powered by a power circuit 60 (FIG. 4) that harvests the AC line voltage 62 into a DC voltage (typically about 5 volts with 10 mA of current) and regulated as such using regulator circuit 64. The power regulator circuit may be of various types including a low-cost transformer-less resistive, capacitive, or bridge rectifier based circuits for less than 30 mA of current, but not isolated from the AC power line. Alternatively, the power regulator circuit can employ a transformer or switcher based design for the advantage of AC isolation safety but are higher in cost. The processor 33 is programmed to emit a group of carrier pulses, and with a specific modulation format, and also with a power level controlled pattern using a digital resistor 48, that is controlled by the processor 33. The processor will typically use a digital resistor 48, or some other means, to generate a power level pattern of pulses that is emitted by the emitter 20. This power level pattern is done during a "ranging" cycle so that the outcome of the cycle is to compute a range between the emitter 4 to a human hand, and hence to the receiver(s) 18.

Referring to FIGS. 4 and 6, the power (or power harvesting) circuit 60 may employ a varistor 66 to reduce the effect of voltage surges. The power circuit 60 may have isolation and employ a power reducing component (resistive, capacitive, SCR, or transformer) to minimize heat that may generated to potentially damage the circuits.

Figure 8:
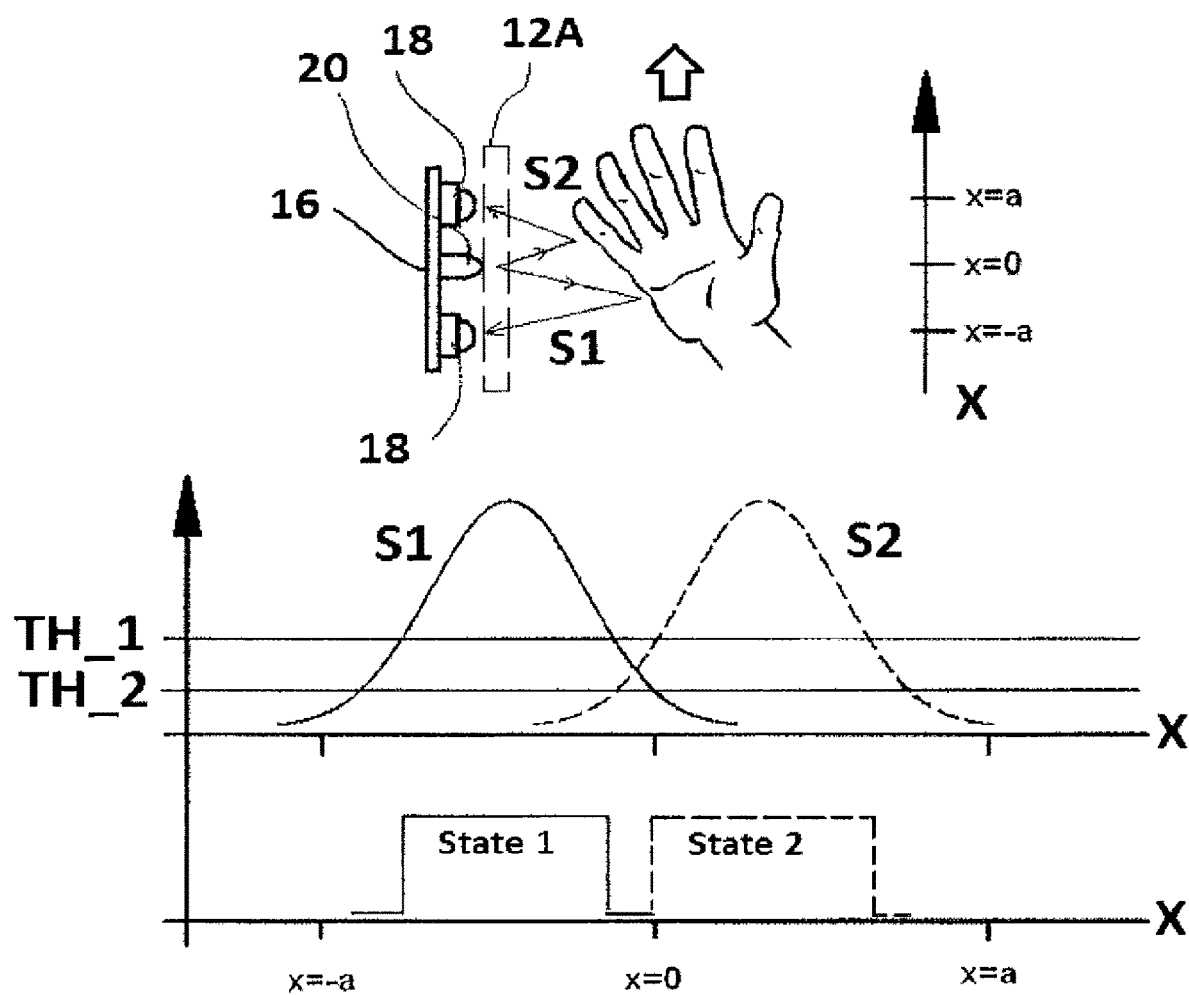
FIG. 8 is a graph depicting a distance measurement and signal processing functions in the switch device of FIGS. 1 through 3.

Referring to FIG. 8, the gesture motion sensor assembly 16 deploys two receivers 18 and one emitter 20 for the purpose of sharing the IR emitted by the emitter to generate two ranging signal outputs from the receivers simultaneously. These will be denoted as S1 and S2. Each receiver will input a signal S1 and S2, respectively, that when processed by the processor 33 will be proportional to the range. The range signal is generally computed as the sum of all high events recorded by the receivers during the ranging cycle. For example, the range value R1 (between sensor and hand) is computed as the sum of all HIGH points clocked during the ranging cycle. R1 will be higher when distance is low, so that the value of R will increase with the value of S. If the number of power levels clocked during the ranging cycle is 256 (for an 8-bit counter) then the range will vary between 0 and 255.

In the example of FIG. 4, a process of dimming of the switch 10 may be carried out using the Triac 40 to control the power output of the switch to the load using a series of timed switched events during the phase of the AC cycle. In this case the Triac 40 starts in the ON state from the positive AC waveform cross-over, and is switched-OFF. Thus, the Triac 40 may use the sensor range information to control a series of timed phase-based switch-off events. This may be done using the output of (S1+S2)/2 as a combined range signal. If the phase control is done over a 60 Hz cycle then the method of dimming requires that the 60 Hz interval be divided into "N" ranging cycles representing N intensity levels. Thus, equivalently, N ranging steps may be defined and equal to N intensity levels. Note that the actual value of N will vary with the clocking speed of the processor 33.

Figure 9:
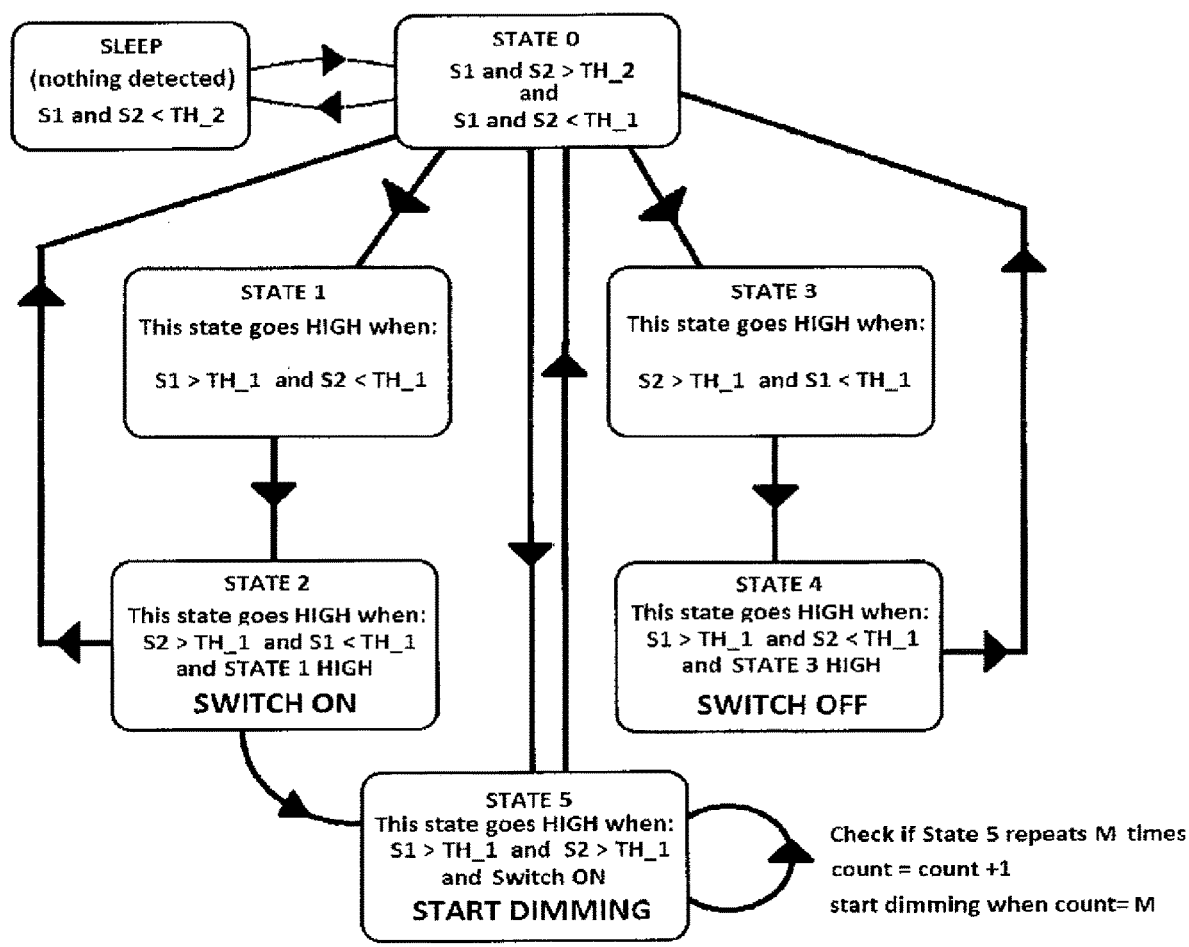
FIG. 9 is a block diagram of the algorithmic states and switch states of an exemplary switch device.

Switching may be achieved by using logic defined in FIG. 8 and FIG. 9, where S1 and S2 must exceed a threshold "TH_2" to be able to change states from SLEEP to State 0. The logic is as follows: as the hand moves through the lower receiver 18, S1 goes high in proportion to R1 (i.e. the range value of S1) in the ranging cycle, hence S1 exceeds the switching threshold, but S2 remains below the threshold. Hence State "0" goes to State "1". When S1 goes below the threshold as the hand advances to upper detector 18 and S2 exceeds the threshold and goes high in proportion to R2 (or the range value for S2), then State "1" advances to State "2". In State "2", the switch goes to the ON state from OFF. The switch internally advances to State "0" but remains in the ON state. Conversely, if the hand moves from S2 down to S1 then the process is reversed, and the switch internally moves from State "0" to State "3" and hence to State "4". In State "4" the switch goes to the OFF state from ON. Hence if signals S1 and S2 have sub-threshold (i.e. less than TH_2) values then the switch reverts back to State "0", leaving the switch state unchanged. In some exemplary embodiments, a process of making switching immune to side movements of the hand is as follows: as the hand moves sideways through the switching zone, switch signals S1 and S2 are both increased at the same time. If both S1 and S2 exceed the threshold TH_2 then they both will not trigger the first logic statement to move into State "1" or State "3". If accidentally state "1" or State "3" is switched then neither will advance to State "2" or "4" because S1 or S2 will not elevate again thereafter, and the switch will advance to state "0" the rest statering to FIG. 9, if S1 and S2 both exceed TH_2 and this condition is held for "M" iterations (i.e. when the hand hovers for a period of time), then the switch enters State 5 or the DIMMING mode starts. In DIMMING the switch will select a dimming intensity (DI) for the switch as a function of the values for S1 and S2, or as the average value DI=(S1+S2)/2. This may be implemented as the CPU 33 using the DI value and choosing a Triac 40 phase shut-off timing signal 20 (see FIG. 6), or as a PWM signal input 44 to the LED driver 54 (see FIG. 7).

A DIMMING mode may be implemented in various ways. If the DI value is known for gesture sensor configurations FIGS. 1A and 1B, then the light intensity may be calculated to allow the user to move their hand outward to inward to increase load intensity, and conversely inward to outward to increase load intensity. It is also possible for the user to move their hand upward or downward to vary load intensity. For FIGS. 1C and 1D, the user's hand can possibly move in a clock-wise or counter clock-wise movement over the switch-plate to vary load intensity. This is achieved by having multiple signals (four or more) such that the pattern of hand movement can be detected as a rotation, and the direction is converted into a load intensity increment or decrement. In FIG. 1D, this configuration can detect finger touch movements that can be modeled as a finger position relating to DI, or also as a two-finger touch or "pinch" such that the spacing between two fingers can be related to DI. Various other methods of continuous hand movements or variations may be achieved using FIGS. 1A, 1B, 1C, and 1D sensor configurations, depending how the hand movements are sensed by the gesture sensor.

In some exemplary embodiments, such pulsed electromagnetic radiation emission by emitter 20 may be substantially constantly operating, although it is also within the scope of the present disclosure to shut emitter 20 down periodically, or when desired, or using an automatically operating SLEEP function. The SLEEP function operates when the light switch has not changed for a time period (of no activity). This may occur when a timer has exceeded in value and when the switch is in ON or OFF state. In the SLEEP mode, the switch is in a pulse mode such that the emitter is pulsing periodically, (such as at one second intervals), or otherwise infrequently to consume lower power. If a hand or other reflecting object comes close to the switch, a simple check of reflected IR at a low threshold TH_2 will cause the processor 33 to come out of sleep to full switch operation or on ACTIVE mode (which is State 0 in FIG. 9).

Receivers may be provided such those sold under the brand Vishay, model numbers TSOP4838, and TSOP4856. Various other receivers are available that have varying characteristics that make the receiver response linear or more sensitive by using a built-in automatic-gain controller (AGC). Configurations may be provided to reduce environmental/ambient noise in the signals received by the receivers, from ambient sources, as well as indirectly from the LED array 24 and/or the visual indicator 14.

A detection zone may be provided in front of the cover plate, for example up to about six inches from cover plate 12, or a greater distance from the transparent panel (or interface cover) 12a of the cover plate 12. The linear variation is typically affected by the sine wave of the line voltage and the nonlinear variation of a range based sensor operated with direct range (or Z movement of the hand), or with a finger or hand moving across the cover plate (or as X movement of the hand). Such nonlinear effects may be corrected by using a simple Look-Up table to set the minimum and maximum values, as well as the variation in between the extremes.

The detectors 18 may be located under the panel 12a (or panel 12b) such that the electromagnetic waves emit through the medium of the panel 12a from emitter 20, and reflect back through the medium to detectors 18. A suitable substrate material may be chosen allow the electromagnetic waves to penetrate without causing undue noise due to internal reflections. It is necessary for the values of TH_1 and TH_2 be chosen to exceed this internally measured noise level for the switching and SLEEP functions to operate correctly (see FIG. 8).

The switch device 10 may be effected by using the activation of only one detector 18, to perform switching such that the signal from any single detector exceeds the threshold TH_1. Hence, the states ON and OFF may be achieved algorithmically in processor 33. Phase switching and dimming may also be achieved using phase-based switching, and for current controlled LED and LED arrays. Alternatively, other methods of toggle switching may use alternate components that may control higher voltage switching not limited to lighting. By way of example and not limitation, an AC version of switch device 10 may comprise an IGBT photovoltaic relay, single pole, normally open 0-280 VAC or 0-400 VDC 1.0 A AC/DC switch, such as that available from International Rectifier as part no. PVX6012.

Thus, in some exemplary embodiments, a touch-less, digital electrical switch is provided that includes at least one sensor, and at least one emitter, that is oriented or associated with other elements in such a way as to detect toggle or directional vertical sweeping, or switching motions using absolute or relative distance measurement. When an intended switching motion is sensed by the sensors within a predetermined distance, and with a predetermined gesturing motion, the status of a switch is communicated to other components within the switch, if any, to effect the "position" of the switch as changed. An indication of the "position" of the switch may be provided by way of a visual indicator. Similar gestural input by the user's hand may dim the light intensity of the switch using a range based movement (perpendicular to the switch plate), or linear movement (parallel to the switch plate). Similarly, switching and dimming may be enabled by an external controller, external radio network, or a connecting computer or PDA.

In some exemplary embodiments, a gesture sensor may be configured with any combination of emitters and receivers. The emitters and receivers may define a sensory signal path of range measurement. If desired, the motion sensor assembly may be configured with a single receiver followed by two emitters, each placed above or below the receiver in spaced relation to said receiver. The receiver does not necessarily have to be co-linear with the emitters. A sensor may also be provided with a single emitter and a single receiver.

In some exemplary embodiments, two receivers may be placed between the emitters but also in spaced relation to the emitters, but also in spaced relation to each other receiver. As an example, the receivers can be placed on the midway line between the emitters, in a cross configuration, as shown in FIG. 1C. The benefit of such an arrangement is to detect gesture activity that is not only along the co-linear path (i.e. vertical path when installed in a wall location, for example) but also perpendicular to the gesture detection path, for example to detect a gesture that requires the hand to move about the left and right side of the switch. Examples of such gestures are the circular motion of the human hand. The switch may detect a 2-dimensional gesture movement that involves up/down and left/right movement at the same time. This type of switch function may widen the applicability to many switch designs and gestures detectable.

In some exemplary embodiments, for example as shown in FIG. 1D, additional IR emitters may be placed in spaced relation to the said receivers inside the gesture sensor to detect additional IR radiation for the purpose of improving the gesture detection over a wider area of the switch plate. This design may use a relatively larger number (i.e. greater than two) of receiver elements configured as an array for the purpose of detecting IR reflection from a hand or finger tips to detect a richer series of gestures like the movement of a fingertip across the substrate of a switch-plate. This may allow the user to move their individual fingers along the plate and allow them to be detectable rather than the whole hand. Examples of gestures detectable are: finger swipes for ON/OFF, circular movements of the fingertips to indicate a dimming function in a clockwise or counter-clockwise movement.

In some exemplary embodiments, the support 22 may be a printed circuit board (PCB) in a single unit with components placed on its underside. Using a hole in the PCB the receiver (for example) may be mounted on the underside of the board and re-oriented such that the sensory side of the receiver is facing outward through the hole. This arrangement of the receiver may serve to save component height and allow for the receiver to be further isolated from IR signal cross-talk from the emitters.

Figure 10A:
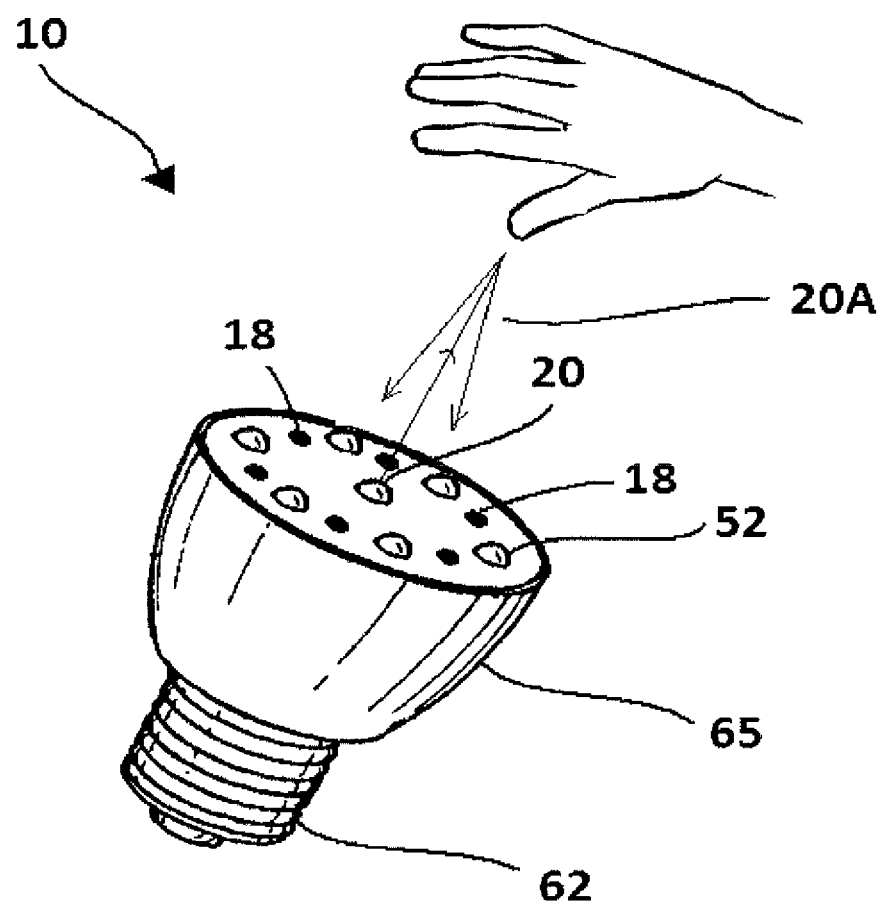
FIG. 10a is a perspective view of an LED light employing a single emitter and a circular arrangement of the receiver sensors.

In some exemplary embodiments, a sensor apparatus may be embedded inside the housing of an LED bulb, with examples thereof being shown in FIGS. 10 and 10A. The sensor apparatus may be the shape of a simple linear array of emitters and receivers (i.e. as one emitter and two receivers, or one emitter and two receivers), or be in the shape of a circular array of receivers surrounding the periphery of the LED housing. The placement and design of sensor components may be useful for the type of gestures that may be detected. For example, the linear design shown in FIG. 10 may detect swipe gestures mainly, as well as hover and ranging for dimming purposes. However, the design with sensors around the periphery (as shown in FIG. 10A) may be used to detect circular movements and gestures that indicate circular movements either clockwise or counter-clockwise. Example functions for these gestures may include, among others, to dim or brighten the lamp, as well as to enable pattern mode or color changes. Both approaches may be used to detect gestures that detect that the human hand is moving abruptly toward the bulb, so as to turn the LED lamp ON/OFF.

FIG. 1D illustrates a switch provided with three emitters 20 and detectors 18, in a 2×5 matrix configuration, that is providing five detector pairs or groups of two shown at 18*a*, in which selected ones of the detectors are oriented in x and y axes, allowing for movement to be detected in both directions arising in non-linear gesture movements either from an open hand, or from a single finger tip moving across the surface. In this example, the five detector pairs detect movement in a y (vertical) axis, and detectors in each of the detector pairs across the switch detect movement in an x (horizontal) axis, while inclined detector pairs shown at 18*b* or 18*c* detect movement in an angular direction midway between the x and y axes. In this example, the three emitters would be multiplexed, and linear motion of vertical swipes are easily detectable and separable from hand movements across the switch (i.e. in the x-axis). Also, fine finger tip movements can be discerned and indicated using indicator LED's in the display 24.

Figure 11:
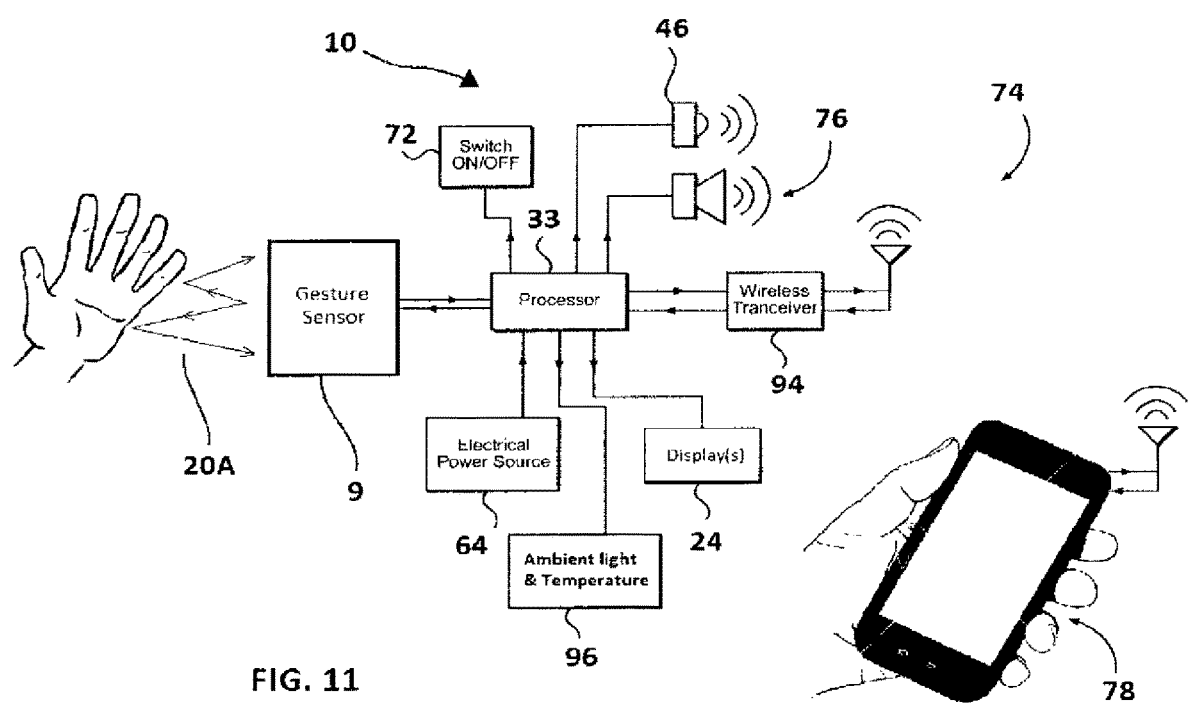
FIG. 11 is a block diagram of the components for a smart switch.

In some exemplary embodiments, smart features may be applied to the switches to allow them to operate in specific modes independent or in concert with the gesture sensor. In FIG. 11 a central processor 33 of the sensor switch 72 may be configured to carry out automatic gesture detection functions as discussed herein, but in addition allow for selection of command action associated with wireless operation of the switch 72. Smart operations may also include features of the switch that may add cosmetic styling to the switch, such as display module 74, including colored LED arrays, LED displays, and sound effects that may add feature and entertaining value to the switching experience. Sound effects (for example, like clicks or simulated switching actions) may be handled by audio module 76, including an internal speaker, buzzer, or miniature piezo device or the like. An external device 78 (like an iPhone, Android device, computer, etc.) may also be configured to communicate with an internal wireless device (such as handheld IR remotes, RF devices, Bluetooth™, BLE™, Wifi, Zigbee™, or the like). Smart application programs may also be configured to provide an external device available for controlling and managing the operation of a smart switch. Examples of remote operation are to set the switch function to be relay only (i.e. OFF/ON), triac switching and dimming, rooms set for automatic motion detection, enabling light switches in some rooms but not others, setting alarm conditions in certain rooms in a home or office, patterned or colored lighting in certain rooms of the home, etc.

In some embodiments, a gesture detection and switching sensor may be inserted inside a general purpose external switch housing. This may distinguish from using a switching device inside a standard AC load switch box, and may be placed on a wall, or on a shelf, or made part of a remote control to do functions that are not similar to placement inside standard electrical light switchbox. The device may be powered with an AC adapter, phone line power, battery powered, or solar powered, typically depending on power availability and location of operation. The device may be wired, or use wireless features associated with many type of wireless control in the household or industrial environment.

Examples of wireless devices are: handheld IR remotes, RF devices, Bluetooth™, BLE™, Wifi, Zigbee™, or the like. Such a device may also be internet connected (wired or wireless) for long-range monitoring and control purposes, data telemetry, and security monitoring. Such a device may detect many types of gestures and do multiple switching such as swipes (left/right), and swipes (up/down), hand movement (in/out), circular gestures, as well as many types of gestures that use a combination of said gestures, including hover and in-hover gesturing.

Figure 13:
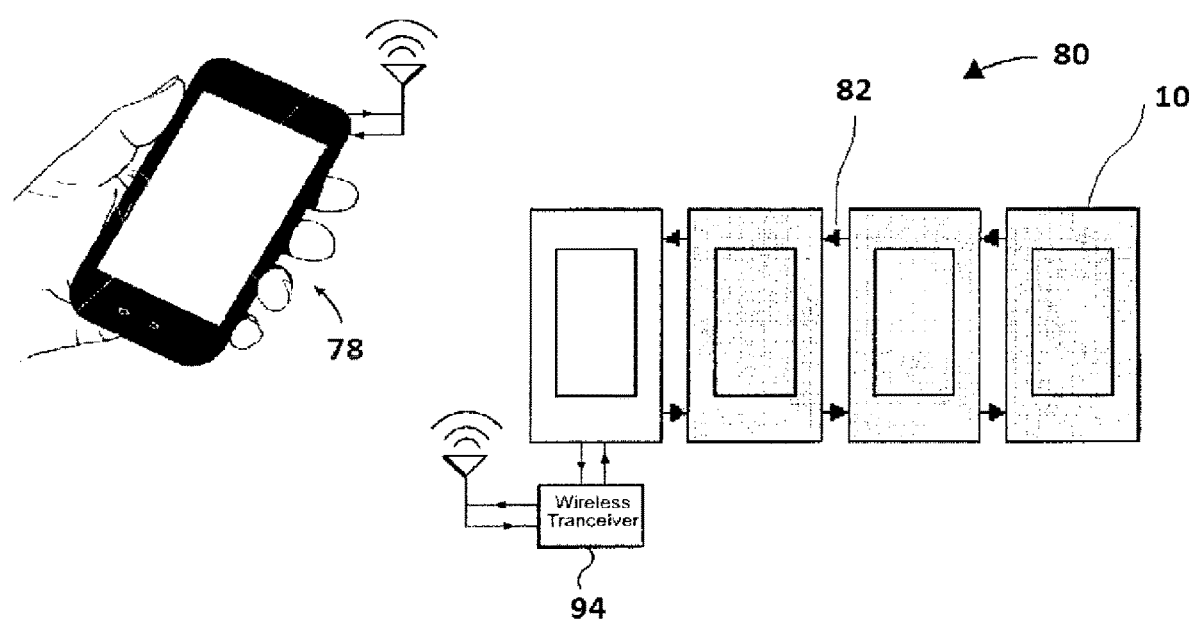
FIG. 13 is a representation of ganged switches and the communication path for implementing ganged switch management strategies.
Figure 14:
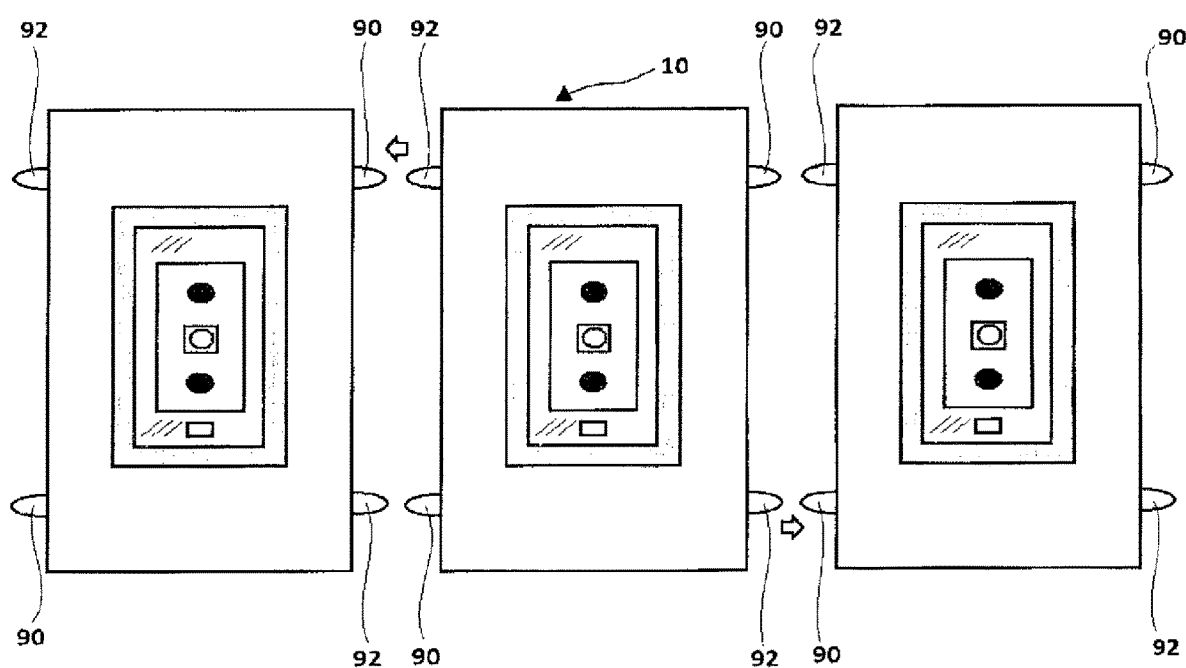
FIG. 14 is another representation of ganged switches.

FIGS. 13 and 14 illustrate a switch assembly shown at 80 having an array of switch units 10, each switch unit is configured to sense a user gesture by receiving a gesture signal indicative thereof, and to change a designated switch state in response thereto. Each switch unit 10 in the array is further configured to exchange one or more interrupt signals with one or more neighboring switch units in the array. Each switch unit 10 is configured to function in a first interrupt mode to originate one of the interrupt signals after receiving a first gesture signal, and to function in a second interrupt mode to receive one of the interrupt signals originating from another switch unit in the array. Each switch unit is further configured to suspend, in the second mode, a subsequent change of the designated switch state under one or more designated conditions. Referring to FIG. 14, each switch 10 is configured to communicate to neighboring switches using a transmitting LED 90 and a receiving LED 92. In this way any of the three array switches is in contact with the other(s). The transmitting LED's may thus send simple digital data as IR pulses from 90 to 92 to communicate any required instruction. This simple method of communication can allow for switch ganging and other functions.

Figure 16A:
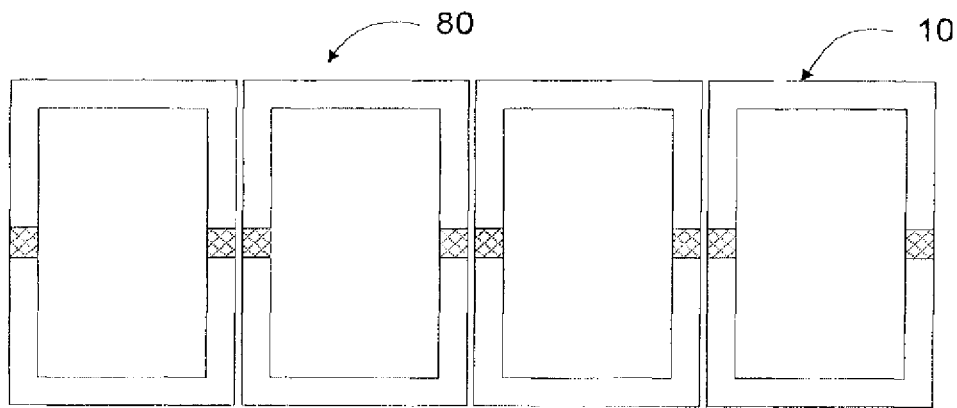
FIGS. 16A to 16D are sequential representations of exemplary operating mode indicators of the ganged switches of FIG. 14.

FIGS. 16a to 16d also provide an example of a color representation for hand-based dimming in the ganged switch assembly 80 where, as shown in FIG. 16A, the LED band display 24 is lit with the BLUE marker LED in the middle. As the human hand is placed in front of the sensor, in FIG. 16B, the "hover" gesture is detected and the LED band display 24 changes color to GREEN with the marker LED activating and changing position as UP or DOWN the display. In one example, the hand position may move the LED marker up (as in FIG. 16C) or down, or the marker LED may follow a ramped or programmed movement based on timing. UP may indicate higher light intensity, and DOWN may indicate lower intensity. When the hand is quickly pulled away from the switch, as in a sudden gesture out of the sensing zone, the level intensity setting of the switch may be maintained, hence when gesture switching occurs the same level will always appear. This is an example setting, but many combinations of display are possible. Also, many different shapes of the LED band display 10 can be realized. Examples can be rectangular, square, elliptical, circular, or even recessed patterned designs.

Some exemplary embodiments may provide hands-free switches that operate in a manner that is capable of distinguishing between directional hand movement which is intended to turn them on or off, be immune to arbitrary motion, and/or be hands-free light switches which mimic the operation of conventional, wall-mounted electrical switches. Such switches may also perform gesture recognition of hand movements to change modes that also do dimming operations, for example.

Referring to FIGS. 13, 14, and 15A to 15C, some embodiments may be configured to accommodate a situation in which swiping a hand in front of a switch for a "Gesture" command may be difficult to isolate which switch is intended to be operated. This may arise in cases where switches may mounted closely side by side in a gang box (two or more switches) as the hand can cover more than one switch at any given time and activating the another switch on either side of the switch to be controlled. This may be addressed, in some cases, by having ganged switches 10 communicate with each other to determine which switch sees the strongest signal (in terms of reflected IR for example) and that switch then becomes the master or dominant switch. A master switch may be determined by the level of the return or reflected IR signal that the gesturing hand in front of it provides. The switch with the highest IR return or signal strength may then become the master controlling switch and thus indicates this to the user by a predetermined front of switch LED response (LED light can move in a predetermined direction or with a change of color or both as this is manufacture programmable function). When a switch is assigned as the master, then any adjacent switch may be told to not operate until the user leaves or pulls their hand away from the unit. This message may then be communicated to all the switches by the gang box IR LED's by means of a wired, or wireless message sent.

It some exemplary embodiments, a strategy of switch ganging may be dependent on the direction of switching. For example, if the switch unit is a directional switch or toggle switch, all other ganged directional switches may then be disabled. In this case, IR reflection signal strength (measured in the sensor) may be used as a discriminator to decide which switch shall be on, and hence which ganged switches shall be disabled. This design forces the user to place more hand area or physical emphasis on the dominant (or master) switch so that it dominates during the switching process. Also, if the dominant switch is off and switches on, then this dominant action should deactivate the other switches that may otherwise switch-on. However, this should not overrule the other switches to switch-off if that action is not desired.

Figure 13A:
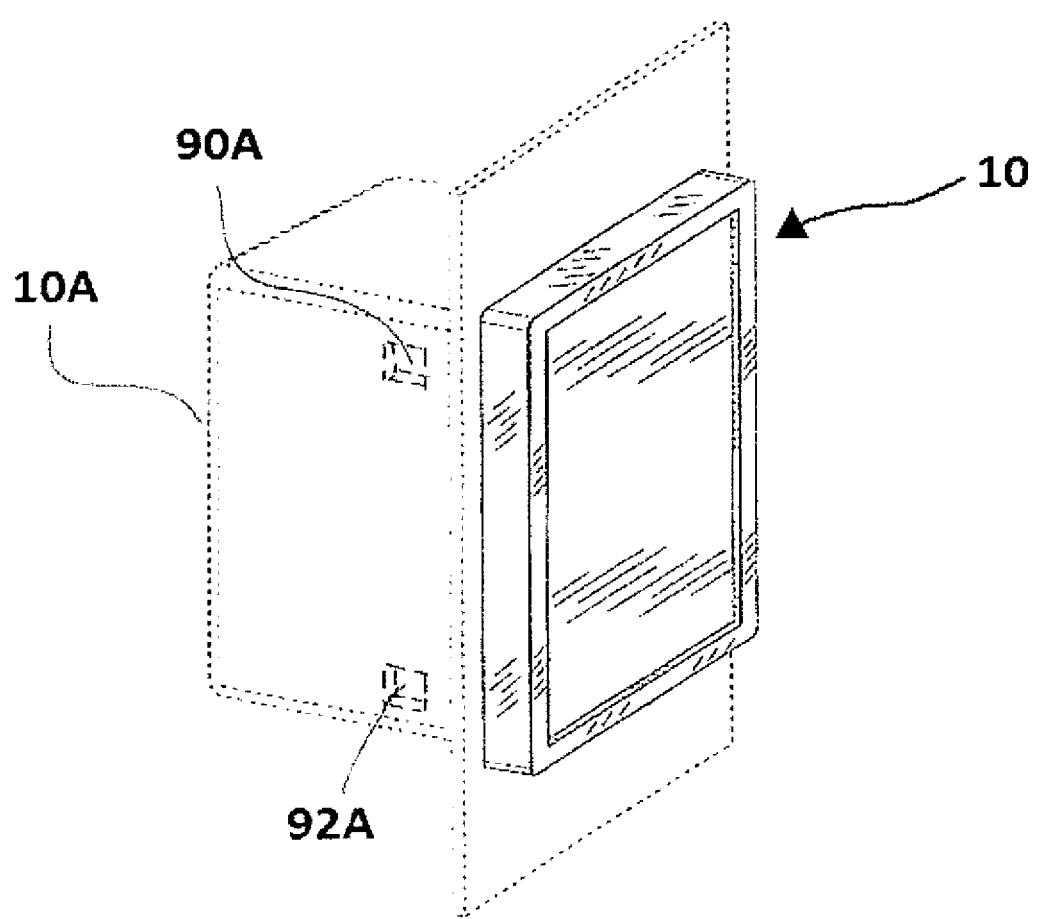
FIG. 13A is a perspective view of an exemplary housing for a switch for use in the ganged switch management of FIG. 13.
Figure 13B:
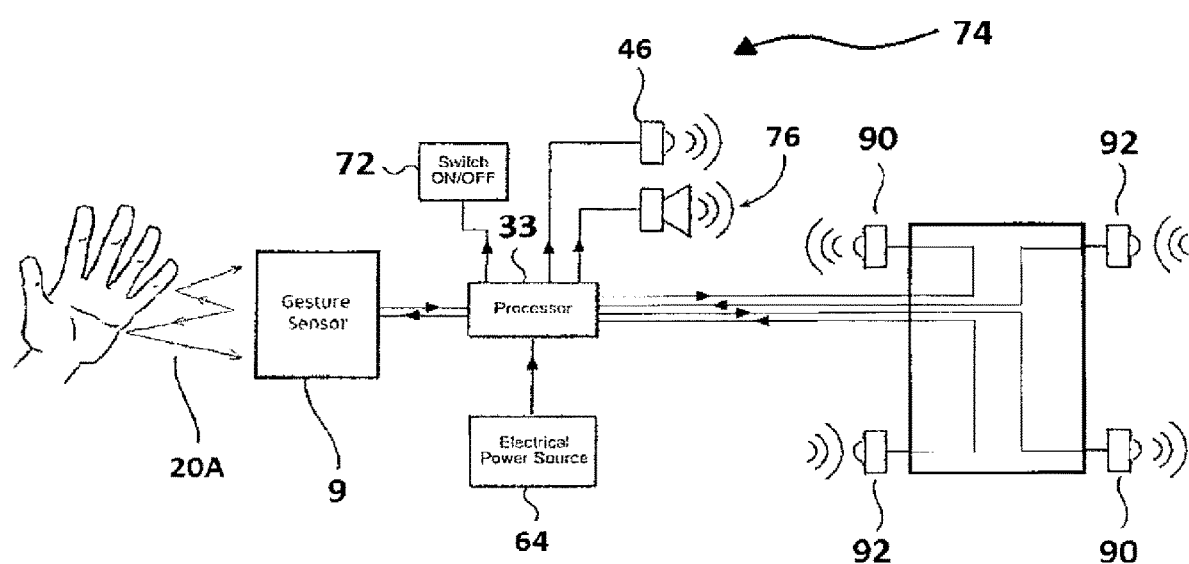
FIG. 13B is a schematic of an exemplary switch device for use in the ganged switch management of FIG. 13.

In some exemplary embodiments, in the event that a master ganging switch is not used, switches may be ganged by using gesturing as the dominance criterion. A switch is dominant when a gesture event (like switch-ON, or switch-OFF) occurs before any other switch would otherwise occur. For this purpose a simple hardware IR diode may be strategically installed in each such housing 10a, such as in or near one or more sides or corners thereof, as shown at 90a and 90b in FIG. 13A. Referring to FIGS. 13A and 14, an IR transmitter diode 90 is installed at the upper left and lower right of each switch, with an IR receiver diode 92 at the lower left and upper right. The action of deactivating the non-dominant switch unit is to send a signal to the upper left of each unit that deactivates all switches to the left of the dominant switch. Conversely the dominant switch unit may send a signal to the right of all switches at the base of the switch. Other ways of deactivating the associated switches may be to send a wireless or RF signal to other switch units by instructing them to deactivate. Another approach is to use the IR sensing capability and send a data signal using the gesture sensor components themselves. This action may be somewhat more complex by requiring that the gesture sensors be synchronized to receive a data signal from the dominant switch unit. Communications as described herein between switch devices, may occur between such devices immediately beside one another, or may be distant or remote from one another, or combinations thereof.

In some exemplary embodiments, by creating an in-line communication link between switches other features may be introduced. A dedicated receiver/transmitter may be designed to receive wireless commands (IR or RF) and relay them to the switches within the gang box. This device may have the same dimensions as the switch and fit within the gang box but be a dedicated wireless receiver and transmitter only. An advantage may be that a relatively more costly unit may talk to lower cost switches, as shown in FIG. 14. This dedicated switch may then serve the purpose of doing only ganged switching for all switches in the ganged arrangement, like switching all switched ON, or OFF. Programmed switching may also be done using this configuration.

Figure 15A:
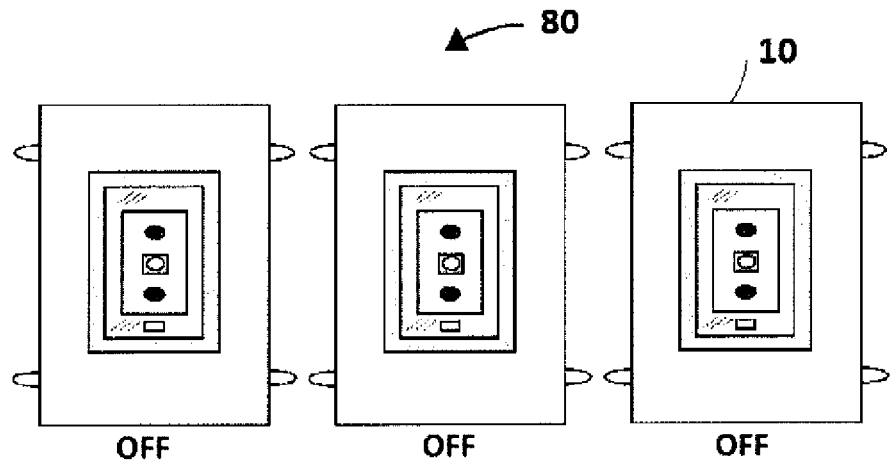
FIGS. 15A to 15C are sequential representations of exemplary operating modes of the ganged switches of FIG. 14.
Figure 15B:
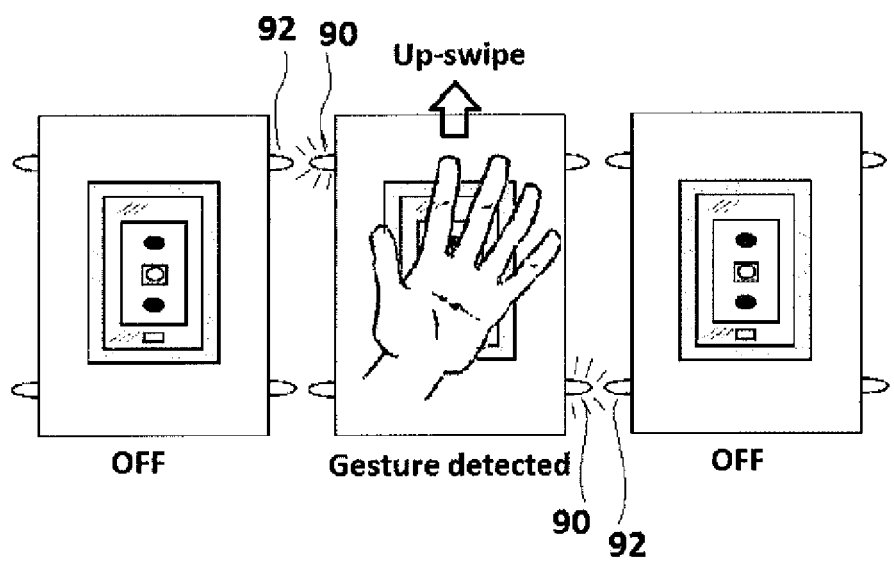
Figure 15C:
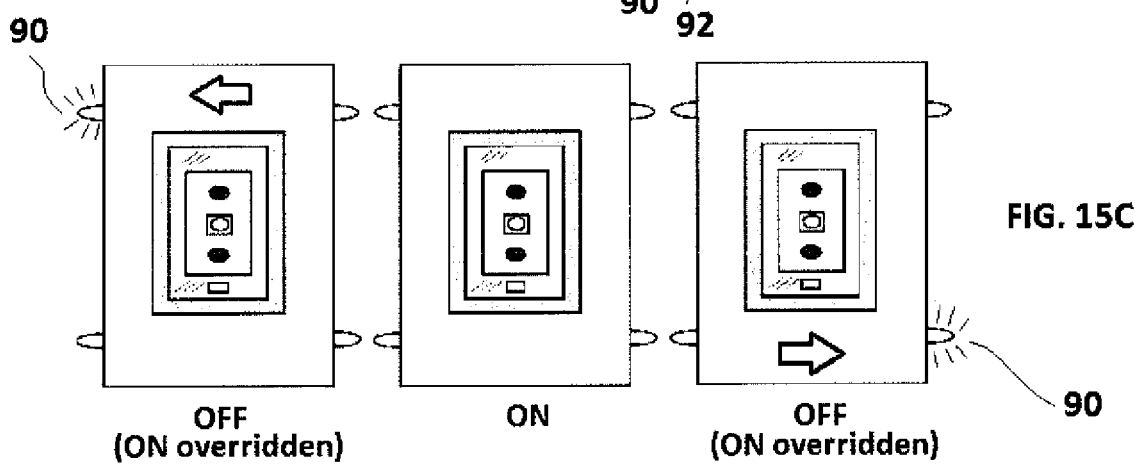

Referring to FIGS. 15A to 15C, a first sequence can be seen in which, in FIG. 15A, three ganged switches 10 are in SLEEP mode. FIG. 15b shows the instance in which a gesture is detected by a center one of the three switches 10, which initiates the center switch to be active, and to issue signals on the IR transmitters 90, which are then received by the left and right switches, by way of their IR receivers 92. The ON center switch then responds to the gesture, in this case an "up-swipe" and implements a change in the status of the switch 10 in light thereof, for instance a transition from OFF to ON, abruptly in a switch on mode, or a ramped transition from OFF to ON in a dimmer mode. As can be seen in FIG. 15C, the left and right switches, on receiving the signal from the IR transmitter 92 are now switched to an inactive state and are both OFF, with the center switch being ON. In addition, the left and right switches issue signals on their IR transmitters 92, effectively to relay the signal received from the center switch to a neighboring switch, should one be there.

Figure 16B:
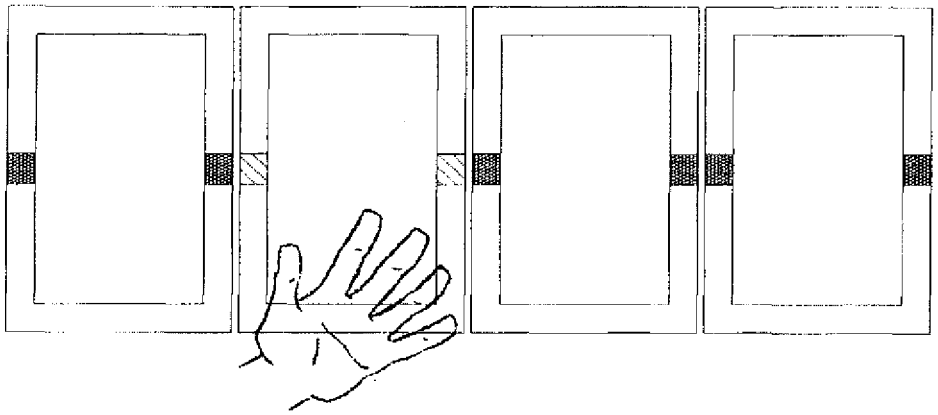
Figure 16C:
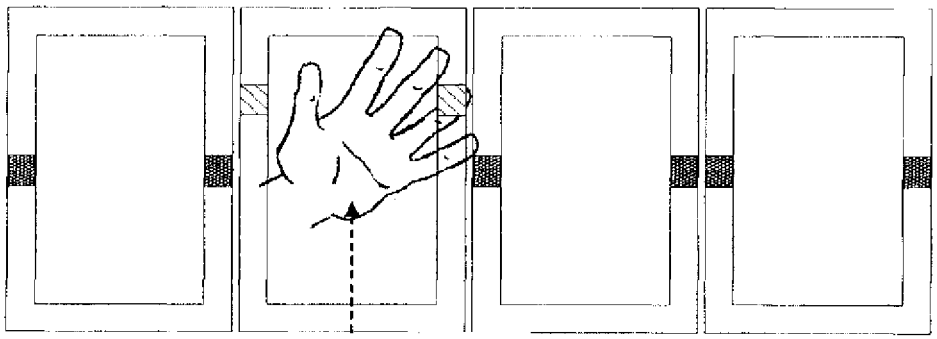
Figure 16D:
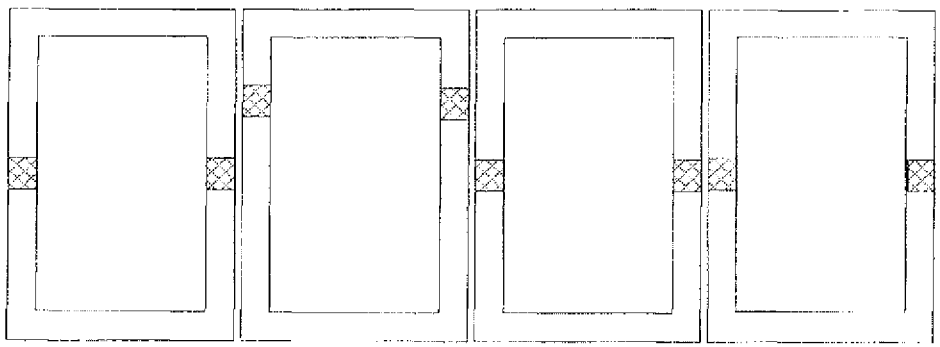

FIGS. 16A to 16D shows a similar sequence to FIGS. 15A to 15C, in this case showing an exemplary version of the corresponding changes of state of the LED display 24 resulting from the detection and response to the gesture. In FIG. 16A, all switches in the gang have a pair of aligned central LED zones lit in a sleep status color, such as blue. On a central switch detecting a hand, as shown in FIG. 16B, it immediately transitions to an active mode, with a corresponding change of status color to active, such as green. On the central switch transmitting the signals to the neighboring switches, they transition from sleep status to overridden status, such as red. In FIG. 16C, the central switch tracks the gesture, in this example, with the LED display showing two paired LED sectors moving upwardly, either to follow the hand gesture or to indicate an active transitioning of the switch, while the remaining switches are overridden. In FIG. 16D, with the gesture action finished, the central switch, with the remaining switches are in SLEEP mode, with the central switch now in a different switch state, such as ON.

Some exemplary embodiments may provide a motion detection system built inside a light switch gesture sensor. The method is to set the switch to a SLEEP state and define a threshold TH_2 that awakens the switch depending on the environmental conditions. Such conditions may include the presence of a moving body (person, pet, object, or the like). The switch may then determine with a set of sensing devices built into the switch housing or circuitry, a means of detecting small changes in IR capture, small changes in reception of passive IR, small changes in reception of external IR from sunlight or external interfering IR. The light switch may be set by a timer to go into SLEEP mode, but the switch may be awakened by a threshold trigger that puts the switch into a NORMAL operating state from SLEEP. Alternatively the NORMAL operation may be defined as an ALARM state if sensors are triggered to indicate that object movement is detected if the switch is decidedly put into SLEEP to operate as a security alarm.

In some exemplary embodiments, a gesture switch may be deployed as a motion detection device for security alarm purposes, based on changing the mode of the sensor to detect IR reflections at longer range. This may be done by using a single receiver or a plurality of receivers and/or additional sensors to detect changes in the environment. Other receivers or sensors may be used generally for the switch alarm to make a better decision related to detecting an alarm state.

Referring to FIG. 11, in some exemplary embodiments, a switch sensor may be provided to communicate information in the form of data bits to each other in a multiple access manner. Switch devices 10 (or otherwise referred to as switch sensors) may be assigned identifying codes for the purpose of indicating the source of the data communication and each sensor has the means to receive the data bits, by way of transceiver 94 from another similarly configured switch device 10 or from an external device 78, such as a smartphone, and perform meaningful actions associated with switching. Such actions may include ganging enable or disable, as well as master switch instructed switching action. Security features may be built into the switch based on communication between switch sensors. Such switch communication may not have to occur just for adjacent ganged switches but for switches across the room, or from remote action switches.

In some exemplary embodiments, a method of switch communication may be based on using the emitter of one switch sensor and transmitting a preamble data segment if signaling out to any receiver that is part of another similar but unattached switch sensor, in the vicinity of said transmitting switch sensor. The receiver sensor of the receiving switch may synchronize with the sending switch sensor, and decode the data and perform the task requested. The sending and receiving switch sensors may operate on the same carrier frequency (i.e. at 38 KHz) as the gesture-sensing switch, with synchronized or common data send/receive protocols. Alternatively, the sending and receiving switch sensors may choose a different carrier frequency (like 56 KHz) to not interfere with gesture sensing and switching operation. Such said communicating switch sensors can transmit data packets of any kind such as switch state, gang state, motion detection information, temperature, ambient light levels, etc.

In some exemplary embodiments, switch sensor communication may be used as an alternative to direct-wired or direct-path ganged switches, with the advantage that some ganged switches do not have close proximity to each other. Also, wireless transceiver 94 equipped switches have the additional advantages that may include communication nodes for security purposes, or for communication data for display purposes (i.e. for a switch with an LED display). These transceivers may be used to relay data of various kinds between similarly equipped switches, as well they may be used to be ganged to a master switch 80 as shown in FIG. 13.

Figure 12:
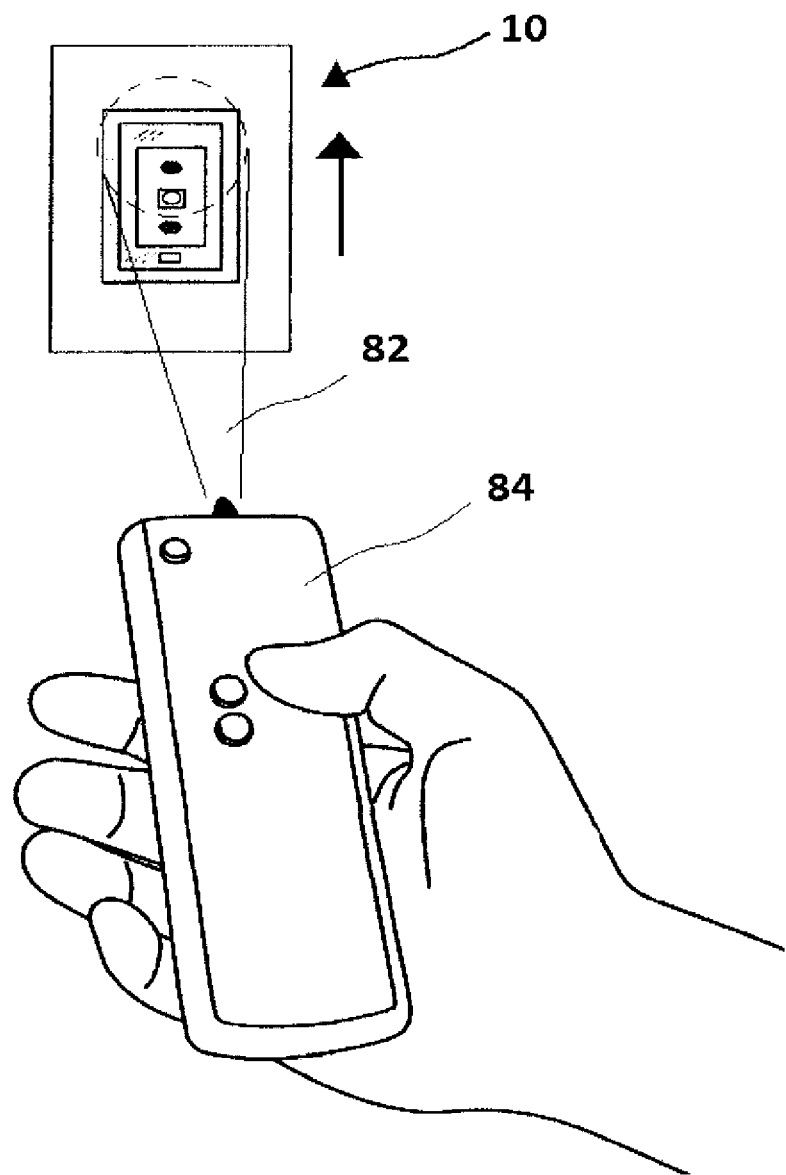
FIG. 12 is a representation a remote device transmitting a signal to a gesture sensor causing a switch event to occur.

Referring to FIG. 11, in some exemplary embodiments switch sensors may be configured to accept data communication from a remote device (such as handheld IR remotes, RF devices, Bluetooth™, BLE™, Wifi, Zigbee™, or the like). IR remotes have the advantage that they are similar to switch-to-switch communication mentioned earlier. However, the beams of IR remotes may be trained at the switch and physically used to select the switch needing activation. Referring to FIG. 12, if a beam 82 from a remote 84 is trained or positioned toward the switch (such that the switch changes color or indicates otherwise that it is being alerted), then the remote may be externally gestured to activate ON (for example) by the upward movement of the IR remote beam, and conversely move down for the OFF state. This may be applied, for example, to switches illustrated in FIGS. 1A and 1B. It is also possible for the remote to be moved in a circular fashion to indicate that light dimming is required, by either the clockwise movement (to increase light intensity) or counter-clockwise movement (to decrease light intensity) of the IR remote. This may be applied to switches illustrated in FIGS. 1C and 1D.

Alternatively, in some exemplary embodiments, the IR remote may be used with digital communication to select a "data-based" gesture to activate the switch ON/OFF, apply dimming, or other switch features. Other wireless devices associated with the switch will act like a digital IR remote. This type of dimming can be done using a smart-phone equipped with wireless transceiver 94 communication of the types mentioned earlier. A smart-phone, tablet, laptop, notebook, or other portable computing device may be enabled with an application software that allows switching and dimming functions to occur by pressing radial buttons on the smart-phone's touchscreen, or by applying a swipe gesture to the touchscreen using said application software. Dimming controls can be applied as a "fader" style control where the user can slide their finger on the touchscreen in a linear or radial manner. The smart-phone may send a data stream of control information through to the switches wireless transceiver 94 to allow the switch CPU 33 to compute DI external from the said switch's gesture sensor.

In some exemplary embodiments other methods may be applied to detect gestures for the purpose of making improved safe gesture recognition in the event that there is sufficient external interference to cause gesture sensing to fail. The alternative methods of gesture detection would be to not use IR receiver tuned to a specific carrier frequency (like 38 KHz) because there are other IR devices (plasma TV's, incandescent bulbs, CFL's, and natural phenomena like sunlight, etc.) that may directly interfere with this carrier. Alternative IR remote receivers that sense at other carrier frequencies like 10 KHz, and 56 KHz, have the advantage that fewer devices use these carrier frequencies for other purposes. Depending on the level of interference rejection required it may be necessary to have a switch with multiple IR receivers installed and allow the switch to choose a different operating carrier depending on the level of interference in the environment of said switch.

In some exemplary embodiments, if an IR based switch sensor fails to operate completely, then there is a physical switch built into the sensor such as shown in dashed lines at 98 in FIG. 3 (with suitable provision made in the cover plate 12A for the switch to be exposed outside thereof) that operates like a switch and dimmer depending on the mode methods that are programmed into it. Alternatively, the sensor circuit cover 12A may have one or two micro tact switches mounted under it and on the sensor circuit board. Applied micro pressure on the top end of the cover plate 12A will activate the switch ON state when depressed, and the bottom tact switch will activate the OFF state when depressed. Another option for such a design feature is for the tact switches to simply toggle regardless if the top or bottom switch is depressed. This is optional for the design of the switch operation using a digital tact switch and this will depend on user preference.

In some exemplary embodiments, an alternative approach to fixed frequency carrier sensing may be to use a carrier frequency that can be altered at any time to be received by a receiving unit that can also have its receiving carrier adjusted to a different but matching carrier frequency. Such a design of a receiving circuit would require that the receiving circuit use an adjustable Band-pass filter to allow for signal filtering at the required carrier frequency. Such switch sensor circuits may need to use other methods of measuring IR signal strength like A/D conversion at the receiver end, or spread-spectrum methods to detect and filter signals from multiple switches. An IR receiver of this kind may need to be a custom built circuit that does not use common low-cost remote receivers available, but has the flexibility to reject IR interference using alternative signal processing methods.

In some exemplary embodiments, use of an ambient IR light detector mounted inside the transparent panel 12A of a switch may also useful to measure IR interference. This feature may determine if the IR detected is sufficient to cause saturation of the IR in the receiver. Such a sensor may determine interference sources are predominant and may require that the switch display that gesture switching cannot be performed adequately. Another useful factor may be if the transparent panel 12A is made of a material that partially filters IR light, like around the 700 to 850 nm near IR range, to suppress many sources of stray or interfering IR in the household or industrial environments. Such an available material is Acrylite FF (9K020) which is known to filter IR bands at wavelengths less than 850 nm. This includes filtering all visible light spectra making the cover plate 12A non-transparent hence hiding the sensor from direct viewing. This material and other suitable plastics are good enough to filter out the effects of plasma TV's, incandescent bulbs, and CFL lights.

In some exemplary embodiments, an IR-based switch may be used as a motion detector in the sense that the SLEEP threshold TH_2, and the switching threshold TH_1 may be set to a very low values. This may be useful for a variety of applications that may aid security of a commercial or household setting, as well as an economical feature to conserve electrical energy. In this case the switching threshold is set to a low value typical of detecting small changes in the IR reflection environment. If this threshold is slightly greater than the background ambient levels of a room area (due to ambient sources like sunlight or other light levels), then motion of people or machinery can be detected to either switch-ON the light or activate an alarm. Alternatively, a low threshold can be used to switch-OFF a light in the absence of motion detection. An IR-based sensor switch is not as sensitive as a PIR switch would be to detect human IR radiation, but it can be sensitive enough to detect motion changes at 950 nm if the receiver is set to a sensitive setting by pulsing at a slower rate. This kind of setting can allow the IR-switch to operate as a motion detector for up to a 5 or 10 meter range.

In some exemplary embodiments, if an IR based switch overheats due to the electrical load being higher than the specified value, the IR sensor processor can use an enhanced method to reduce the switch load power. The method of reducing power is based on the sensor processor using an applied temperature sensor. Most common processors on the market have built-in temperature sensors and as such become useful for sensing an overheating circuit. Typically if a triac overheats (due to a high power load) the excess heat must be conducted to another metal surface to dissipate. Methods of heat control may provide heat conductive layers or traces, as shown at 86, such as with metals such as copper, lead, tin, steel, metal alloys, as well as other heat conductive not necessarily metallic, and the like to conduct heat into a ground-plane or to the ground box of the switch. Other methods may use the transformer iron core or other metal components to dissipate heat. If these methods are not satisfactory, then another approach is to use the triac to "dim" the load to reduce triac power throughput. This approach would be to sense the temperature and allow the switch processor to change the DIM setting automatically or in some controlled manner. The approach mentioned here could processor software to use a heat vs. dim setting table. Another implementation is to simply switch-OFF the load if the heat is excessive.

Figure 17:
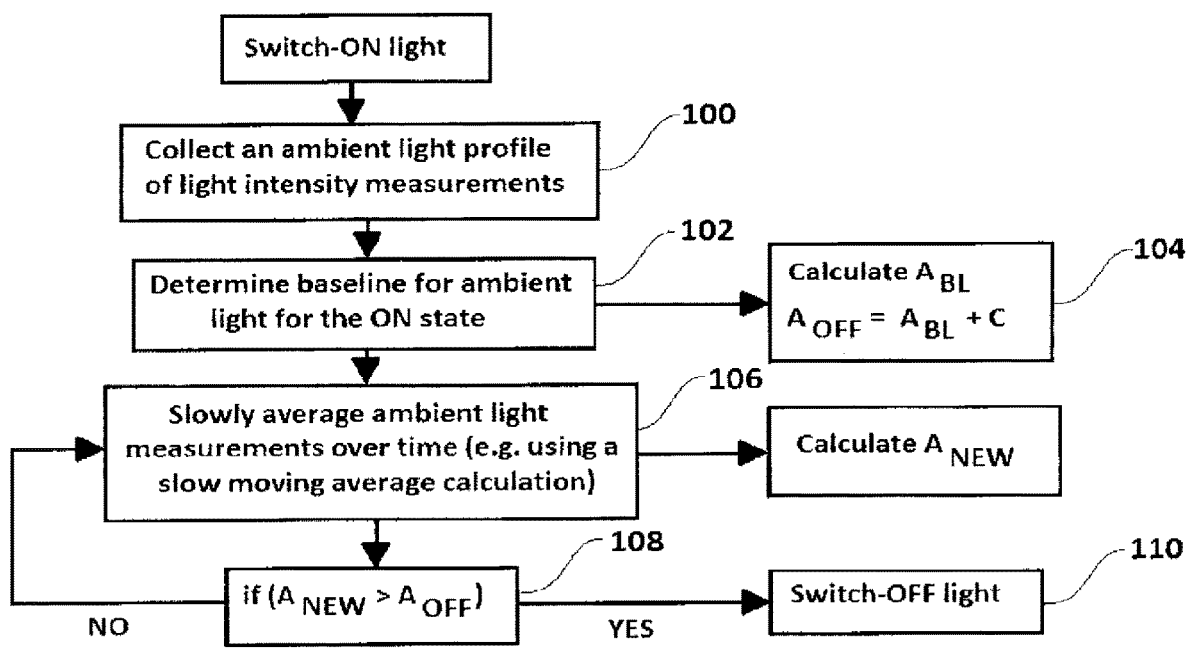
FIG. 17 is a flow diagram of an ambient light monitoring process.

Referring to FIG. 17, in some exemplary embodiments, an IR based switch may be configured to save energy by detecting that the morning has arrived and hence will switch-OFF the light switch load, if said light switch is active. This is an energy saving feature utilizing sensors as described herein, and is based on detecting that ambient light levels have gradually increased to an acceptable level to warrant switching off the light. This feature involves an active monitoring of ambient light intensity levels, by way of ambient light sensor 96 in FIG. 11. The method is to detect a profile in the ambient light measurements that contribute to the switch-OFF decision, and then to collect one or more such profiles, as shown at step 100. As an example, the energy saving procedure may detect that ambient light has levels have risen from a lower level determined from the time the light was switched on. A "baseline ambient level" $A_{BL}$ may then be determined, at step 102, over a period of time that the switch is ON (which can include human motion and shadowing activity), by the formula in step 102, in which $A_{OFF}$ is the average-based level to initiate switch off, and C is the difference measured between $A_{OFF}$ FF and the average-based base line $A_{BL}$. At step 106, the device may continue to update a current average ambient light level, such as by using a slow moving average calculation, to yield an updated average-based $A_{NEW}$. At 108, the device may then compare the current average ambient level $A_{NEW}$ with the average-based level to initiate switch off $A_{OFF}$. If yes, the device switches off the light at 110 and if no, the device reverts to step 106. Thus, switch may ultimately detect that ambient light from additional sunlight (or other sources) has gradually increased to the level that warrants the light to be switched-OFF.

In some exemplary embodiments, relative measurement of the emitter and receiver combination that can enable dimming. By moving a human hand or any reflective object close to the sensor apparatus, continuous sensing of 1) range, measured perpendicular to the switch plate, can be measured continuously, and 2) lateral displacement, measured parallel to the switch plate but between the receivers mainly, can also be measured continuously. Dimming may be accomplished by converting the touch-less hand movements into light intensity values. To allow the continuous movement to be linear, a processor coupled with random-access memory may use a look-up table to correct for nonlinear effects and make the dimming movement smooth and linear between the extremes, but abrupt and constant at the extremes.

In some exemplary embodiments, a touch-less switch is provided that uses a gesture sensing algorithm to detect motion such that the user moves their hand up to change the switch state to ON, and move the hand down over the switch-plate to change the switch state to OFF. If the user continues to move their hand up over the switch plate, the switch shall remain in the ON state, or conversely, if the user moves their hand down repeatedly, the switch will remain in the OFF state. If the user moves their hand from "side-to-side" over the switch plate, the gesture sensing algorithm shall be immune to false ON and OFF detects. The gesture sensing algorithm uses intermediate states to detect whether a side movement occurred and rejects this gesture.

In some exemplary embodiments, a function may be provided for putting the processor to "SLEEP" when the sensor has not performed any switching or dimming action for a timer period (for example, 20 seconds). This is a mode that the switch enters into when the switch needs to consume less power for applications where power conservation is important (battery powered applications, for example). When the sensor enters SLEEP mode the emitter and receivers are not operational, but the sensor will periodically "wake-up" (for example, every 0.5 seconds) to emit a short carrier burst with a pulse sequence that is designed to detect a hand or other object hovering nearby. If human hand or object movement is detected then the sensor will power-up to full operation at the maximum range measurement speed and resolution required to detect the incoming gesture.

In some exemplary embodiments, the gesture algorithm may incorporate a means to detect a gesture that allows for a change of state between, for example, switching and dimming. The gesture algorithm may detect, for example, a hand or object be placed over the sensor apparatus and held stationary for to start a timer (for say 2 seconds), this event may allow the switch to change mode from ON/OFF switching to continuous dimming. Dimming mode may be terminated by a timer allowing sufficient time for the user (for example, about 10 seconds to alter the settings). Similar gesturing may accomplish mode changes as similar but different gestural recognition movements, and timing related changes, to alter the switch modes.

In some exemplary embodiments, a common LED light powered by line voltages has a power supply and two receiver and one emitter gesture sensor built into the frame. The methods of powering may be isolated or non-isolated, resistive, capacitive, diode-bridge rectified, or transformer based, or combinations thereof. This design allows for a power harvested solution for touch-less switching and dimming (FIG. 4 and FIG. 5).

In some exemplary embodiments, alternative electrical switching applications may include: a wall based switch, a Triac switch for phased-based switching and dimming, a DC powered switch for LED or LED array lighting with current-based dimming, or light-bulbs with a gesture switch sensor built-in (see FIG. 10).

Some exemplary embodiments, may provide a light switch device comprising a switch output, a gesture sensor configured to be responsive to gestures in a sensing zone adjacent the gesture sensor, a controller in communication with the gesture sensor and configured to carry out one or more switching actions to change an operative switch mode at the output, in response to one or more signals from the gesture sensor representing, at least in part, selected ones of said gestures, an LED display associated with the gesture sensor, the LED display being operable to present one or more switching indications of the one or more switching actions. The LED display may include a plurality of LED's, the LED display configured to emit a plurality of colors, each color displaying a designated switching indication. The LED display may include an array of LED's along a peripheral region of the gesture sensor. The LED display may include at least one signal transmissive cover segment, the LED's being positioned behind the cover segment. The LED display may be configured to provide a central LED sector showing a first color representative of a sleep or inactive mode, and a second color representative of an active mode. The LED display may be configured to represent a changing switching action as a transition to a higher LED light intensity or to a lower LED light intensity of at least one of the LED's. The gesture sensor may be configured to detect a moving gesture location, the LED display configured to activate one or more LED's in progression to follow the moving gesture location, or according to a ramped or designated pattern in response thereto. The gesture sensor may be configured to detect a first sudden gesture out of the sensing zone, the controller configured to set a level intensity setting of the switch according to a current level.

One or more exemplary embodiments disclosed herein may provide a device which is capable of switching and dimming functions in a light device, which may in some cases provide sensors which enable gesture detection that may allow a switch sensor to carry out one or more of the following features: 1) complex gesture detection, 2) change of operation mode, 3) continuous sensing operation as opposed to discrete operation, 4) multiple sensor arrangements for hand and finger detection, 5) external sensor triggering, and 6) security and energy saving features based on motion and ambient light detection.

In some exemplary embodiments, there is provided a method comprising sensing an appendage in a three-dimensional (3D) space disposed in front of a switch device; processing the sensed appendage to detect at least one gesture made by a user within said 3D space and performing an action associated with the at least one gesture.

In some exemplary embodiments, the at least one gesture is associated with a control command for circuitry coupled to the switch device.

In some exemplary embodiments, the appendage comprises at least one of the user's hand, foot and digits.

In some exemplary embodiments, the switch device comprises a plurality of lighting elements responsive to the at least one gesture.

In some exemplary embodiments, the plurality of lighting elements comprises light emitting diodes (LEDs).

In some exemplary embodiments, there is provided a switch device for controlling circuitry coupled thereto, said switch device comprising a faceplate, at least one sensor for detecting movement of a user's hand in a three-dimensional (3D) space disposed in front of said cover plate. Also provided is a processor for determining at least one gesture made by the user's hand within said 3D space and providing a control signal associated with said at least one gesture to said circuitry.

In some exemplary embodiments, a plurality of lighting elements are responsive to the at least one gesture. In this case, the plurality of lighting elements comprise light emitting diodes (LEDs).

In some exemplary embodiments, the circuitry places a light between an electrical on state and an electrical off state, and the LEDs provide a visual indication of said electrical state.

In some exemplary embodiments, the circuitry controls an intensity of a light, and said LEDs provide a visual indication of the intensity.

In some exemplary embodiments, the sensor comprises at least one emitter emitting electromagnetic radiation for reflection by said user's hand and detected by at least one receiver.

In another exemplary embodiment, there is provided an input method for controlling an apparatus, comprising mapping a plurality of hand gestures to corresponding control commands; sensing a user's hand in a three-dimensional (3D) space disposed in front of said apparatus; processing said sensed user's hand to detect at least one of said plurality of hand gestures; extracting a control command corresponding to at least one of said plurality of hand gestures; and executing said control command.

While the present disclosure describes various exemplary embodiments, the disclosure is not so limited. To the contrary, the disclosure is intended to cover various modifications and equivalent arrangements, as will be readily appreciated by the person of ordinary skill in the art.

What is claimed is:

1. A hands-free switch device, comprising a processor, a motion sensor in communication with the processor, and an output, the motion sensor including one or more signal emitters and one or more signal receivers, the processor configured to process data corresponding to signals received by the one or more signal receivers, to detect range or movement of a gesturing user appendage, the processor configured to relate a range value or a movement value to an intended change between at least two modes or states, and to issue a control signal at the output to enable the intended change of modes or states, wherein a first of said modes or states corresponds to an ON/OFF switch mode, a second of said modes or states corresponds to a DIMMER mode, and a third of modes or states corresponds to a SLEEP mode.

2. The device of claim 1, the signal receivers configured to receive one or more first signals from the emitters or one or more second signals originating from a remote device.

3. The device of claim 2, wherein the first and second signals have a common carrier frequency.

4. The device of claim 3, wherein the second signals operatively mimic the first signals.

5. The device of claim 4, wherein the second signals are data-based gesture signals, from a gesture sensed by the remote device.

6. The device of claim 2, wherein the remote device includes a portable computing device.

7. The device of claim 1, further comprising a substrate carrying the processor, and a number of heat generating components, the substrate including one or more heat conductive layers formed to provide a heat transfer link between the heat generating components a designated location for thermal coupling with a external cooling element.

8. The device as defined in claim 7, wherein the cooling element includes, at least in part, an external ground plate.

* * * * *